(12) United States Patent
Ross

(10) Patent No.: US 11,133,705 B2
(45) Date of Patent: Sep. 28, 2021

(54) FACILITY INTERNAL COOLING GRID

(71) Applicant: Amazon Technologies, Inc., Seattle, TX (US)

(72) Inventor: Peter George Ross, Olympia, TX (US)

(73) Assignee: Amazon Technologies, Inc., Seattle, WA (US)

( * ) Notice: Subject to any disclaimer, the term of this patent is extended or adjusted under 35 U.S.C. 154(b) by 127 days.

(21) Appl. No.: 16/145,098

(22) Filed: Sep. 27, 2018

(65) Prior Publication Data

US 2020/0106297 A1    Apr. 2, 2020

(51) Int. Cl.
     *G05B 19/05*      (2006.01)
     *H02J 13/00*      (2006.01)
     *H02J 1/00*      (2006.01)

(52) U.S. Cl.
     CPC ........ *H02J 13/0003* (2013.01); *G05B 19/054* (2013.01); *H02J 1/00* (2013.01); *G05B 2219/1105* (2013.01); *G05B 2219/15097* (2013.01)

(58) Field of Classification Search
     CPC ...... H02J 13/0003; H02J 1/00; G05B 19/054; G05B 2219/1105; G05B 2219/15097; H05K 7/2079; H05K 7/20709
     See application file for complete search history.

(56) References Cited

U.S. PATENT DOCUMENTS

| | | | |
|---|---|---|---|
| 9,485,887 B1 | 11/2016 | Eichelberg et al. | |
| 9,618,991 B1 | 4/2017 | Clidaras et al. | |
| 9,800,052 B2 | 10/2017 | Li et al. | |
| 9,939,790 B1 | 4/2018 | Churnock et al. | |
| 9,997,955 B1 | 6/2018 | Ross et al. | |
| 10,734,837 B2 | 8/2020 | Ross | |
| 2007/0167125 A1* | 7/2007 | Rasmussen | H05K 7/2079 454/184 |
| 2011/0112694 A1* | 5/2011 | Bash | F24F 11/0001 700/277 |

(Continued)

FOREIGN PATENT DOCUMENTS

WO      2017214210      12/2017

OTHER PUBLICATIONS

U.S. Appl. No. 16/145,101, filed Sep. 27, 2018, Peter George Ross.

(Continued)

*Primary Examiner* — Larry L Furdge
(74) *Attorney, Agent, or Firm* — Robert C. Kowert; Kowert, Hood, Munyon, Rankin & Goetzel, P.C.

(57) ABSTRACT

An internal cooling grid is mounted internal to a facility, such as a data center, and includes a plurality of fluid transport elements arranged in a grid pattern with nodes at intersections of the grid pattern. Supply and return manifolds included in the nodes receive (and return) cooling fluid from/to more than two transport elements. Thus, a failure of one or more transport elements does not prevent a node from being supplied cooling fluid from at least a first transport element and a second transport element. In some embodiments, the cooling grid may be operated at a pressure less than one atmosphere, such that any leaks that occur cause air to leak into the cooling grid instead of cooling fluid leaking out of the cooling grid.

20 Claims, 20 Drawing Sheets

(56) References Cited

U.S. PATENT DOCUMENTS

| | | | |
|---|---|---|---|
| 2012/0152777 A1* | 6/2012 | Lin | H05K 7/20745 |
| | | | 206/320 |
| 2013/0193767 A1 | 8/2013 | Carralero et al. | |
| 2015/0256406 A1 | 6/2015 | Palmer et al. | |
| 2015/0334881 A1* | 11/2015 | Romanos Tabuenca | |
| | | | H05K 7/20827 |
| | | | 62/115 |
| 2016/0091262 A1* | 3/2016 | Chainer | H05K 7/20772 |
| | | | 165/104.31 |
| 2016/0370830 A1 | 12/2016 | Miller | |
| 2017/0345101 A1 | 11/2017 | Beaston | |

OTHER PUBLICATIONS

GE, "Microgrid Solutions", copyright 2018, General Electric Company, pp. 1-16.
Peter Asmus, "Data Center and Advanced Microgrids", Navigant Research, White Paper, Oct. 2017, pp. 1-32.
Raj Chudgar, et al., "Unlocking Microgrids", Power Analytics, May 2011, pp. 1-10.
U.S. Appl. No. 15/608,728, filed May 30, 2017, Kelsey Michelle Wildstone.
U.S. Appl. No. 15/475,014, filed Mar. 30, 2017, William Mische.

* cited by examiner

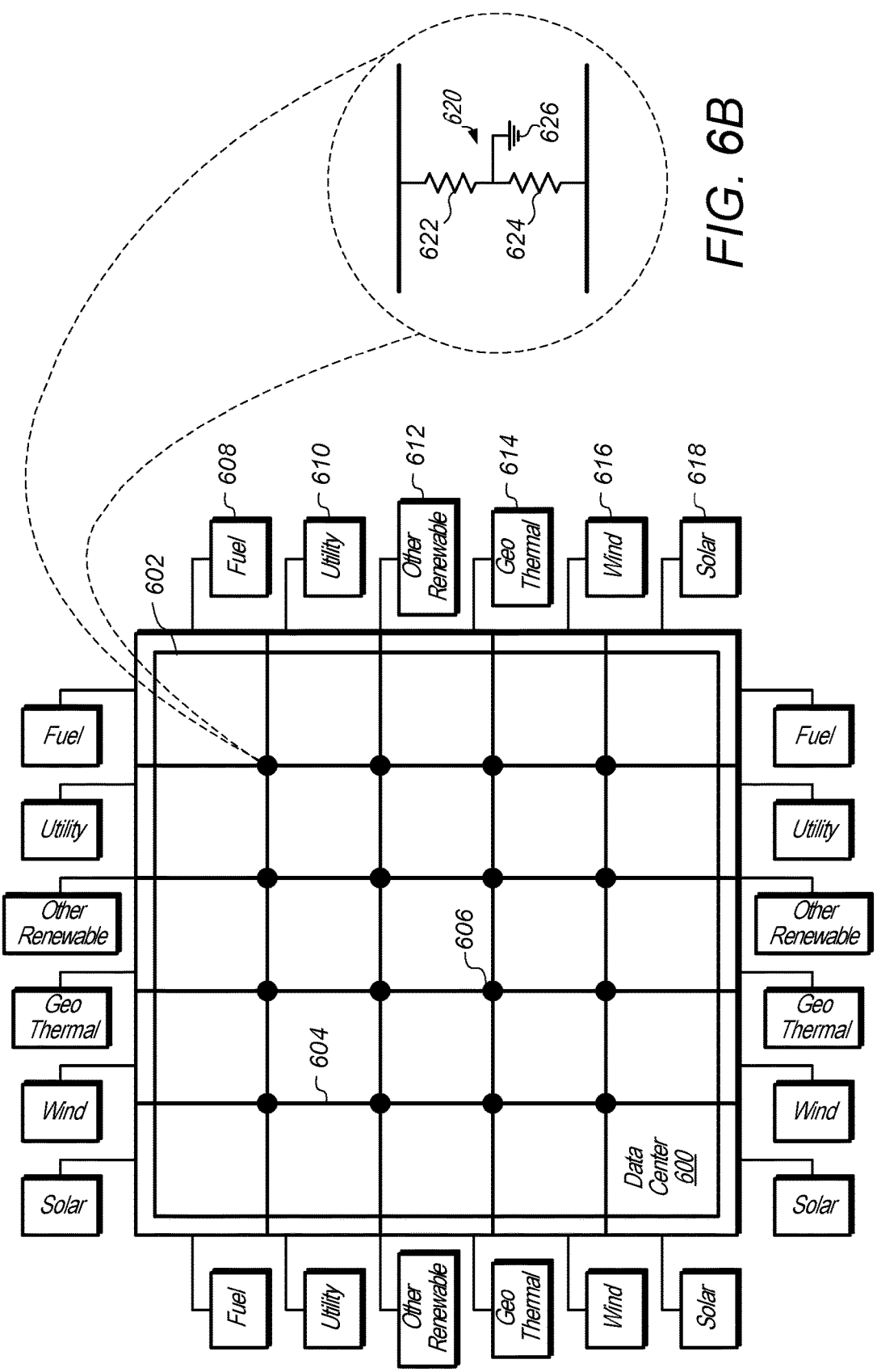

US 11,133,705 B2

FACILITY INTERNAL COOLING GRID

BACKGROUND

Typically operators of large computing facilities, such as data centers, design the facilities to include power distribution systems with a radial branch distribution design that includes one or more main branches and lower level branches fanning out from the main branches. At any given moment in time, each main branch receives power from a single power source, though the main branches may be switched to receive power from a back-up source if a primary power source fails. Such power distribution systems may also include one or more back-up branches with associated lower level branches that are similarly designed according to a radial branch distribution design and that similarly receive power from a single power source at a time. For example, a computing facility may include large pieces of electrical equipment, such as transformers, switchgear, uninterruptible power supplies (UPSs), etc., that receive electrical power from a utility power source and feed one or more main branches of a radial branch distribution design. Lower level branches that fan out from respective ones of the main branches receive power from the respective main branches and supply the power to loads. In some computing facilities, an additional one or more back-up branch circuits may mirror a primary branch circuit. Additionally, cooling systems for such facilities are often laid out using a radial branch distribution design. In a similar manner as power systems, a cooling system for a computing facility may include a relatively large cooler, such as a mechanical chiller, and the large cooler may feed cooling water to a main header that then branches out to smaller branches and ultimately to cooling loads. Alternatively or additionally, an HVAC system of a computing facility may include a main air duct that branches off into smaller air ducts and ultimately to cooling loads.

Such radial branch power distribution systems and cooling systems may be designed for a pre-determined load and a pre-determined load distribution, and may be difficult to modify without significant costs. Also, such radial branch power distribution systems and cooling systems may be significantly impacted by single-point failures. For example, a single failure may cause an interruption in service and/or may render a system without a back-up.

BRIEF DESCRIPTION OF THE DRAWINGS

FIG. 6A illustrates a top view of a power distribution and/or cooling grid and multiple types of power source units connected to the grid along a periphery of the grid, according to some embodiments.

FIG. 6B illustrates a high-ohmic ground path that may be included in a node of a power distribution grid, according to some embodiments.

Figure 1A:
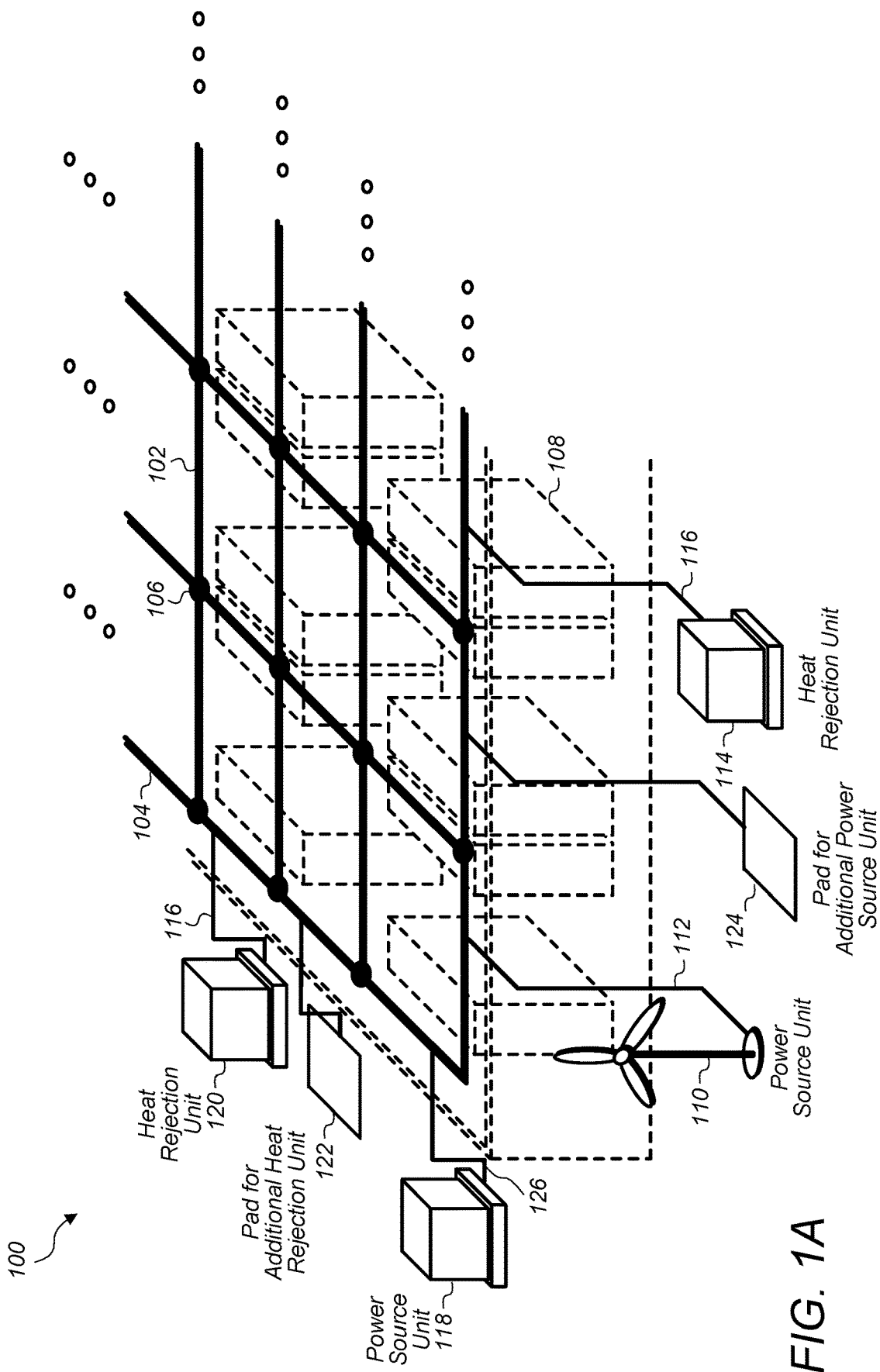
FIG. 1A is a perspective view of a block diagram illustrating a data center that includes a power distribution grid and a cooling grid, wherein power source units and heat rejection units are connected to the power distribution grid and the cooling grid along a periphery of the data center, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a power distribution grid and/or internal cooling grid, internal to a facility, such as a data center, are described herein. In some embodiments, a system includes a plurality of power source units and a data center comprising electrical loads, such as rack-mounted servers, switches, routers, and/or other electronic equipment. The data center also includes an internal power distribution grid connected to the power source units and the electrical loads. The internal power distribution grid is positioned within the data center and includes modular power transport elements arranged in a grid pattern and nodes located at intersections of the grid pattern. The modular power transport elements and nodes are arranged in the data center such that each node is configured to receive electrical power from more than two of the modular power transport elements connected to the node. Also, the electrical loads are arranged in the data center such that the electrical loads receive electrical power from the grid via respective ones of the nodes. In this way, a failure of a given power transport element connected to a particular node that supplies electrical power to a particular electrical load does not result in the electrical load being left without power and a back-up source of power. For example, during a transport element failure at least two remaining transport elements remain configured to supply electrical power to the particular electrical load via the particular node. Additionally, as discussed in more detail below, the use of an internal power distribution grid in a facility, such as a data center, allows greater flexibility to add and/or redistribute electrical loads in the facility without having to re-design or replace existing electrical distribution infrastructure.

In some embodiments, a power distribution system includes modular power transport elements configured to be arranged in a grid pattern to supply electrical power to compute and/or data storage equipment in a facility and nodes located at intersections of the grid pattern. The modular power transport elements and nodes are arranged such that respective ones of the nodes are configured to receive electrical power from more than two of the modular power transport elements connected to the respective node and supply the received electrical power to one or more pieces of the compute and/or data storage equipment in the facility.

In some embodiments, a method includes providing a power distribution grid for a facility, wherein the power distribution grid comprises modular power transport elements arranged in a grid pattern to supply electrical power to compute and/or data storage equipment in the facility and nodes located at intersections of the grid pattern. The method further comprises distributing electrical power to the compute and/or data storage equipment in the facility via the nodes of the power distribution grid, wherein electrical power from more than two of the modular power transport elements connected to a respective node is supplied to the respective node.

In some embodiments, a system includes a data center comprising heat producing components mounted in different locations within the data center and an internal cooling grid positioned in the data center, wherein the internal cooling grid includes cooling fluid transport elements arranged in a grid pattern and nodes located at intersections of the grid pattern. The system also includes heat rejection units connected to the internal cooling grid and configured to remove heat from a cooling fluid flowing through the internal cooling grid. In the system respective ones of the nodes are configured to receive cooling fluid from, and return the cooling fluid to, multiple ones of the fluid transport elements connected to the respective node. Also, the heat producing components are arranged in the data center such that respective ones of the heat producing components are cooled by cooling fluid received from, and returned to, the internal cooling grid via respective ones of the nodes. For example in a similar manner as discussed above in regard to an internal power distribution grid, an internal cooling grid allows for a failure of a given cooling fluid transport element connected to a particular node that supplies cooling fluid to a particular heat producing component without resulting in the particular heat producing component being left without a cooling fluid source and backup cooling fluid source. For example, at least two remaining cooling fluid transport elements remain configured to supply cooling fluid to the particular heat producing component via the particular node. Additionally, as discussed in more detail below, the use of an internal cooling grid in a facility, such as a data center, allows greater flexibility to add or redistribute heat producing loads in the facility without having to re-design or replace existing cooling infrastructure. For example, if a set of servers is replaced with another set of servers that generate more concentrated waste heat, additional cooling fluid may be supplied to the other set of servers that generate more concentrated waste heat via the internal cooling grid, without having to replace piping or ductwork of the facility.

In some embodiments, a cooling grid includes cooling fluid transport elements arranged in a grid pattern to provide cooling support to compute and/or data storage equipment in a facility and nodes located at intersections of the grid pattern. The cooling fluid transport elements and nodes are arranged in the facility such that respective ones of the nodes are configured to receive cooling fluid from, and return the cooling fluid to, multiple ones of the fluid transport elements. Also, respective ones of the nodes are configured to provide the received cooling fluid to a cooling circuit for use in removing heat from one or more pieces of the compute and/or data storage equipment and receive cooling fluid from the cooling circuit that has been used to remove heat from the one or more pieces of compute and/or data storage equipment.

In some embodiments, a method includes providing a cooling grid for a facility, wherein the cooling grid comprises cooling fluid transport elements arranged in a grid pattern to provide cooling support to compute and/or data storage equipment in the facility and nodes located at intersections of the grid pattern. The method further includes flowing a cooling fluid through the cooling grid to provide cooling to the compute and/or data storage equipment in the facility, wherein respective pieces of compute and/or data storage equipment connected to a particular node are supplied cooling fluid via the particular node that is received at the particular node from two or more of the fluid transport elements connected to the particular node.

Facilities, such data centers, or other computing facilities, may operate continuously and, to function properly, may require reliable sources of power and/or cooling to individual electrical loads/heat producing components in the facilities. Many such facilities, utilize radial branch distribution systems and may also use back-up radial branch distribution systems to supply power and/or cooling to electrical loads in the facilities.

In such systems, a primary power system supplies power to electrical loads from a concentrated source, via a primary distribution circuit, wherein lower level distribution circuits receive power from the primary power distribution circuit and intermediate level distribution circuits. For example, a main distribution bus may supply power to multiple zones in a data center, wherein an intermediate level bus in each zone supplies power received from the main distribution bus to even lower level busses that ultimately supply the received power to one or more electrical loads. Some such power systems may include a redundant back-up power system that mirrors the primary power system. However, under normal operating conditions, the back-up power system may not actively supply power to electrical loads, and may instead be idle, awaiting a failure of the primary power system. Because, for the majority of the life of the facility, the back-up power system remains idle, such an approach may result in wasted power distribution capacity. Moreover, when there is a failure in the primary power system and the electrical loads are instead supplied power form the back-up power system, the electrical loads are susceptible to a single additional failure in the back-up power system causing the electrical loads to lose power. Additionally, the higher level distribution busses may be designed for a fixed electrical load when installed and may require significant costs and downtime to be modified or replaced to be upgraded to support a greater electrical load. Thus, in a situation wherein existing servers in a portion of a data center are replaced with other servers that require a greater quantity of electrical power, the whole power distribution system including a lower level bus and all upstream busses, including the main distribution bus, may need to be replaced to support the upgraded servers that have greater power requirements.

Cooling systems for facilities may also be designed in a way that requires significant expense to upgrade. For example, air cooled heat producing components often are cooled by air supplied to a cold aisle via an air duct that is connected to a larger air duct that connects back, via one or more additional higher level ducts, to an air conditioning unit. In situations where a portion of the heat producing components are upgraded to another type of heat producing component that generates more concentrated waste heat, the air conditioning unit and duct system may be insufficient to provide cooling to remove the concentrated waste heat being generated by the upgraded heat producing components, thus requiring significant costs and downtime to upgrade the air conditioning unit and duct system.

In some embodiments, in order to provide greater reliability and flexibility to power distribution systems and/or cooling systems, a grid internal to a facility, such as a data center, may be used. The internal grid may include transport elements and node elements. Each of the node elements may connect with a plurality of transport elements at intersections of the grid pattern. In some embodiments, each transport element may include a high-side power path and a low-side power path (e.g. +200 Volts DC and −200 Volts DC). Additionally, each transport element may include a coolant supply line and coolant return line. In some embodiments, the grid may be laid out such that four transport elements meet at a node location and connect to the node, such that four separate transport elements provide a path for power and/or cooling fluid to reach the node. In some embodiments, a three-dimensional grid pattern may be laid out such that six transport elements meet at a node location and connect to the node, such that there are six pathways for power and/or cooling fluid to be received at the node. Electrical loads and/or cooling loads may be connected to a node and receive power and/or cooling from the node, wherein the node receives power and/or cooling via a plurality of transport elements (e.g. four transport elements, six transport elements, etc.).

In some embodiments, each transport element may be configured to be able to supply a greater proportion of the power and/or cooling being received by a node than its proportion of the number of connections to the node. For example, for a node connected to four transport elements, each transport element may be configured to supply more than one-fourth of the power and/or cooling fluid being received by the node and being used to support electrical loads and heat producing components serviced by the node. In this way, a failure of a transport element does not result in a particular node losing power and/or cooling fluid supply, or being left without a backup source for power and/or cooling fluid. For example, for a node connected to four transport elements, two of the transport elements may fail, for example due to a leak or a short, and the remaining two transport elements connected to the node may have a sufficient capacity to supply power and/or cooling fluid to the node without reducing the power or the cooling fluid consumption by the electrical loads and heat producing components connected to the node.

In some embodiments, multiple power source units and/or heat rejection units are connected to the power distribution grid and/or cooling grid along a periphery of the grid. For example, the grid may be internal to a data center facility and power source units and/or heat rejection units may be placed outside the data center and connected to an outer periphery of the grid. In some embodiments, the power source units may be modular units that can be quickly installed, removed, and/or re-positioned. For example, a power source unit may be skid-mounted such that the power source unit can be moved from location to location with a forklift. In a similar manner, heat rejection units may be modular units that can be quickly installed, removed, and/or re-positioned. For example, a heat rejection unit may be skid-mounted such that the heat rejection unit can be moved from location to location with a forklift.

In some embodiments, a power source unit may include a rectifier, transformer and one or more additional electrical components that covert low voltage power received from a utility power source, such as three-phase alternating current power (AC power), into direct current (DC) power. In some embodiments, a power source unit may include a power generator, such as a quick-start multi-fuel turbine. In some embodiments, a power source unit may include both a fuel-based power component, such as a generator, and a utility power component, such as a component configured to receive and condition power received from a utility power source. In some embodiments, a power source unit may include components that generate electrical power from other types of energy sources, such as renewable energy sources. For example a power source unit may include a wind turbine, solar panel, a geo-thermal power source, hydro-electric power source or other type of power source.

In some embodiments, a power source unit may include one or more batteries, or a stand-alone battery power unit may be connected to a power distribution grid.

In some embodiments, a heat rejection unit may include a heat removal component, such as a heat exchanger, a fluid moving device, such as a pump, and a fluid reservoir, such as a tank. In some embodiments, a heat rejection unit may create a negative pressure to pull return cooling fluid out of an internal cooling grid and may supply cooled cooling fluid to a supply line connected to the internal cooling grid. In some embodiments, the heat removal component of a heat rejection unit may include a cooling tower, or other type of evaporative cooler that cools a cooling fluid by evaporating a liquid. In some embodiments, the heat removal component of a heat rejection unit may include a free cooling heat exchanger that cools a cooling fluid by passing ambient air across a heat exchanger to cool the cooling fluid flowing through the heat exchanger. In some embodiments, a heat removal component of a heat rejection unit may include a mechanical chiller that compresses and expands a refrigerant. In some embodiments, the heat removal component of a heat rejection unit may include an absorption refrigerant unit that utilizes a salt solution and waste heat from another source to produce a chilling effect that cools a cooling fluid. In some embodiments, the cooling fluid may be chilled water, or another suitable cooling medium.

In some embodiments, an internal cooling grid may be connected to a heavily insulated fluid tank. Cooling fluid flowing through the internal cooling grid may flow through the insulated tank. In some embodiments, the insulated tank may function as a large heat sink for the system, especially during periods of high heat load. For example, during spikes in heat being removed by the internal cooling grid, some of the heat may be absorbed by the mass of cooling fluid in the heavily insulated tank, thus lowering an immediate load on the heat removal components of the heat rejection units connected to the internal cooling grid. During periods of lower heat load, an overall temperature of the mass of the cooling fluid in the heavily insulated tank may be reduced, thus recharging the tank's capacity to absorb heat during future periods of high heat load.

In some embodiments, an internal cooling grid may be operated at a pressure below one atmosphere. Thus, any leaks in the cooling fluid supply lines or cooling fluid return lines of the transport elements may result in air leaking into the supply and/or return lines of the internal cooling grid, without cooling fluid leaking out of the internal cooling grid. In some embodiments, an internal cooling grid may include an array of pressure sensors and/or flow sensors to detect leaks in the internal cooling grid. In some embodiments, a vent line from the internal cooling grid may measure an amount of air being vented from the internal cooling grid. If the amount of vented air exceeds a threshold, an alarm system may indicate a potential leak into the internal cooling grid.

In some embodiments, an individual power source unit may provide a relatively small portion of the overall power being supplied to the power distribution grid of the facility. For example, in some embodiments, each power source unit may supply less than 20% of the overall amount of power being supplied to the power distribution grid. In some embodiments, each power source unit may provide approximately 750 kilowatts (KW) of electrical power or less. Because the power distribution grid is not dependent on any single power source unit for a majority of its power, the power distribution grid may be more resilient in the case of a failure of a power source unit. For example, a power distribution grid may include a spare power source unit, such as a fuel-based power source unit, that can be quickly activated in the case of a failure of another power source unit connected to the power distribution grid, wherein the loss of the other power source unit and the activation of the spare power source unit is completed such that the electrical loads connected to the power distribution grid do not go without power. In a similar manner, an internal cooling grid may be connected to a plurality of heat rejection units, wherein no single heat rejection unit supplies a majority of the cooling capacity or cooling fluid flow capacity required by the internal cooling grid. For example, each heat rejection unit may reject out of the cooling grid 20% or less of the overall amount of heat being rejected from the cooling grid. Also, each heat rejection unit may contribute 20% or less of the overall flow volume of cooling fluid flowing through the cooling grid.

In some embodiments, a facility that is provided power by a power distribution grid or that receives cooling from a cooling grid, may be a set of containerized data center modules mounted in an open area or within a facility. For example, in some embodiments, electrical equipment, such as computing devices, data storage devices, networking equipment, etc. may be mounted in a portable container, such as an ISO shipping container. In some embodiments, a set of containerized data center modules may be organized into a cluster and may be connected to a power distribution grid and a cooling grid that is local to the clustered set of containerized data center modules. The power distribution grid and the cooling grid may supply power and cooling to the containerized data center modules.

In some embodiments, a power distribution grid and/or internal cooling grid may be designed for "right-sizing" of power source units and/or heat rejection units to current power loads and cooling loads. For example, a power distribution grid and/or internal cooling grid may be initially commissioned with a quantity of power source units and heat rejection units that match an initial power and cooling load connected to the grid. As power consumption and/or cooling requirements go up or down, additional power source units and/or heat rejection units may be connected to the grid to increase capacity to meet increased demand. Conversely as power consumption and/or cooling requirements go down, one or more power source units and/or heat rejection units may be disconnected from the grid. For example, the disconnected power source units and/or heat rejection units may be moved to, and connected to, another grid that requires additional power and/or cooling capacity.

In some embodiments, a power distribution grid and/or cooling grid may be designed to tolerate failures without immediate maintenance being performed. For example, in some embodiments, transport elements may be sized such that when one or more transport elements fail, remaining transport elements can carry the load (either power or cooling) previously carried by the failed transport element. Thus, in some embodiments, failures may be allowed to accumulate until a threshold number of failures has been reached. At that point maintenance operations may be scheduled to repair or replace the failed components. This may result in a more efficient approach to maintenances as opposed to scheduling maintenance operations for each failure. Also, some facilities may not be staffed with on-site maintenance personnel, thus allowing failures to accumulate before being scheduled for maintenance operations may reduce a number of trips maintenance personnel have to make to a facility to perform maintenance.

FIG. 1A is a perspective view of a block diagram illustrating a data center that includes a power distribution grid and a cooling grid, wherein power source units and heat rejection units are connected to the power distribution grid and the cooling grid along a periphery of the data center, according to some embodiments.

Data center 100 includes internal power distribution and cooling grid 104. Note that in some embodiments, the grid 104 could provide power alone, cooling alone, or both. Grid 104 includes transport elements 102 arranged in a grid pattern and nodes 106 located at intersections of the grid pattern. For example, four transport elements 102 meet at a node 106 for most all of the nodes of grid 104, other than the nodes 106 on the periphery of the grid, for which three transport elements 102 meet at the node location. In some embodiments, grid 104 is a self-standing grid, wherein each node 106 has a structural member such as a beam or leg that extends down from the node to a floor of the facility and, when connected to other self-standing nodes, via a plurality of transport elements, forms a self-standing grid structure that is supported by the legs extending down from the respective nodes of the grid. In some embodiments, a grid 104, may be supported by a structure of a facility. For example, a grid may be suspended from a ceiling of a facility via hangers. For ease of illustration, grid 104 is shown as being suspended from a ceiling in FIG. 1A.

Data center 100 also includes electrical loads 108, which may include a plurality of computing and/or data storage devices mounted in racks. Additionally, electrical loads 108 may include networking equipment, or other types of electrical loads. The electrical loads 108 may be located in different parts of the data center. For example, FIG. 1A illustrates several electrical loads 108 located in different aisles of racks within data center 100. The electrical loads 108 may consume electrical power from grid 104 and may generate waste heat. The waste heat may be rejected from data center 100 via a cooling fluid supplied to the electrical loads 108 via grid 104. For example, each one of nodes 106 may be a connection point that connects one or more electrical loads to power from grid 104 and that supplies cooling fluid to cooling circuits for the electrical loads 108 and accepts return cooling fluid back from the cooling circuits for the electrical loads 108.

Figure 1B:
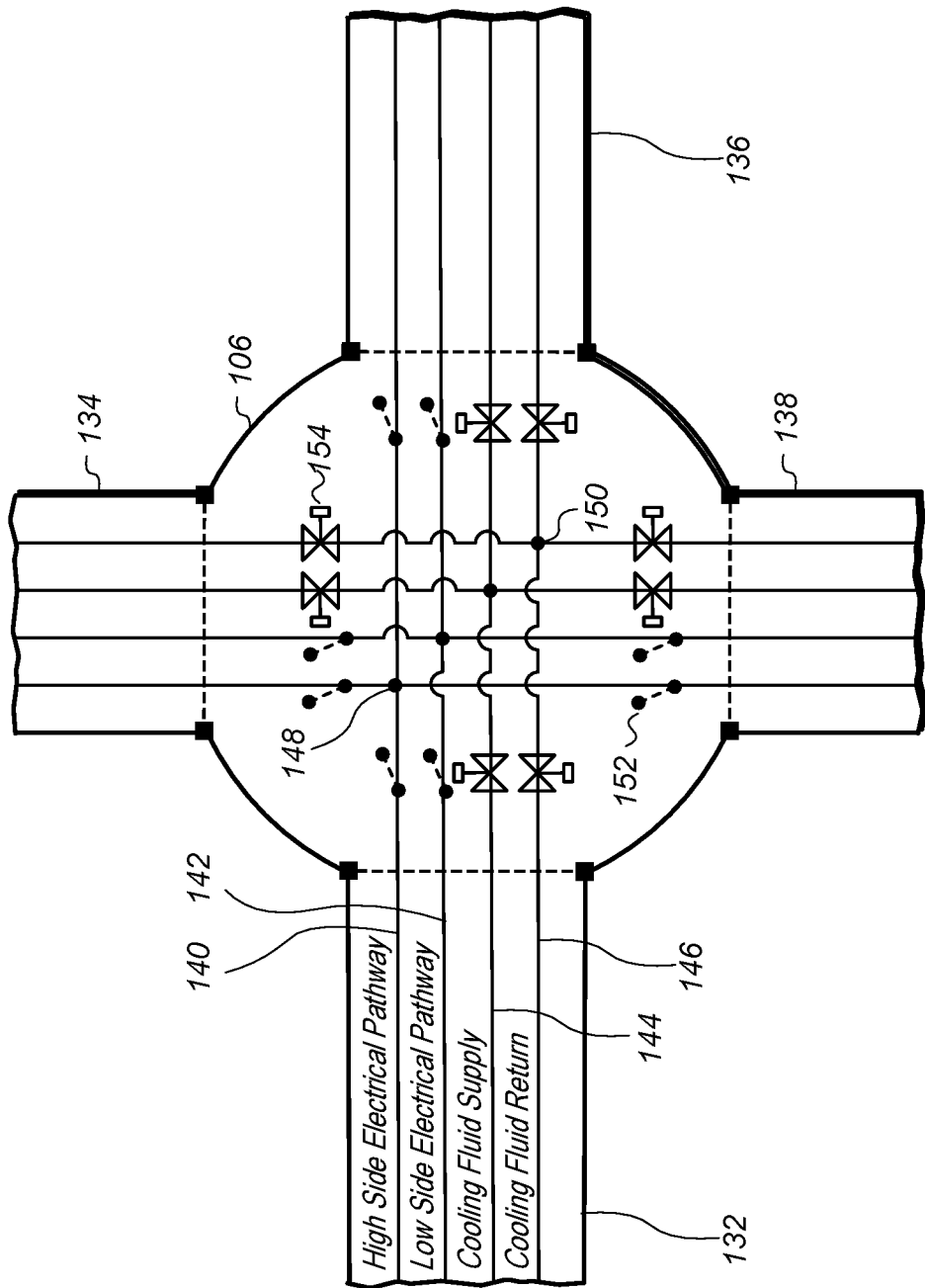
FIG. 1B is a block and line diagram illustrating components of a node of a power distribution and cooling grid, wherein the node is connected to multiple transport elements of the power distribution and cooling grid, according to some embodiments.

For example, as shown in more detail in FIG. 1B, each transport element 102 may include a high-side power pathway, a low-side power pathway, a cooling fluid supply line, and a cooling fluid return line. At a node 106 four (or six, etc.) high-side power pathways may meet at a point that is also connected to electrical loads 108. Additionally four (or six, etc.) low-side power pathways may meet at an additional point that is also connected to the electrical loads 108. Thus the electrical loads can receive high-side power via any of the four (or six, etc.) transport elements connected to the node 106, and can flow low-side power back to the grid via any of the four (or six, etc.) transport elements connected to the node 106. In a similar manner, four (or six, etc.) cooling fluid supply lines may meet at a common manifold in a node 106. Also four (or six, etc.) cooling fluid return lines may meet at another common manifold in a node 106. Thus, cooling fluid can flow into a supply-side manifold (and to a heat exchanger that cools the heat producing components being cooled via the node 106) from any of the transport elements 102 connected to the node 106. Also, return cooling fluid can flow back into the grid 104 from the heat exchanger that cools the heat producing components being cooled via the node 106, wherein the cooling fluid can in turn flow back into any of the transport elements 102 connected to the node 106 via the return-side manifold of the node 106.

In some embodiments, a plurality of power source units and heat rejection units are connected to a power distribution and/or cooling grid, such as grid 104, along a periphery of the grid. In some embodiments, pads and piping and/or wire connections may be provided along the periphery of the power distribution and/or cooling grid to allow for additional power source units and/or heat rejection units to be connected to the grid. For example, grid 104 includes power source unit 118 and heat rejection unit 120 coupled to the grid 104 on a first side of the grid 104 and additionally includes power source unit 110 and heat rejection unit 114 coupled on a second side of the grid 104. Also, there is a pad and associated connectors 122 on the first side of the grid 104 for accepting installation of an additional heat rejection unit and connecting the additional heat rejection unit to the grid 104. Additionally, there is a pad and associated connectors 124 on the second side of the grid 104 for accepting installation of an additional power source unit and connecting the additional power source unit to the grid 104.

In some embodiments, connection piping 116 connects heat rejection unit 114 to grid 104 and electrical wiring 112 connects power source unit 110 to grid 104. In some embodiments, power source unit 110 may be a renewable-energy-type power source unit, such as a wind turbine. In some embodiments, heat rejection unit 114, may be a free-cooling-type heat rejection unit, such as a cooling tower module that evaporates water to reject heat from grid 104. Also, heat rejection unit 120 may be connected to grid 104 via piping connections 116. Heat rejection unit 120 may be a mechanical chiller that provides supplemental cooling when heat rejection unit 114 cannot reject a full amount of waste heat being transferred into grid 104. In some embodiments, power source unit 118 is connected to grid 104 via wiring connections 126. In some embodiments, power source unit 118 may be a utility power source.

In some embodiments, each node 106 supplies power to a power panel of a rack or to a power distribution panel that supplies power to multiple racks. In some embodiments, the power portion of grid 104 includes a direct current (DC) mesh bonded network.

In some embodiments, each of the transport elements 102 are modular elements having standard dimensions. Also, the nodes 106 may be modular components having standard dimensions. For example each transport element 102 may include a high-side power pathway, low-side power pathway, cooling fluid supply line, and cooling fluid return line that are of equivalent sizes and may also include standardized connectors to connect the respective power pathways and cooling fluid lines to corresponding standardized connectors of a node. Thus, as additional space is filled in a data center, additional transport elements and nodes may be added to an internal power distribution and/or cooling grid to grow the grid. Additionally, additional power source units and heat rejections units may be added to the periphery of the grid to increase an ability of the grid to supply power and reject heat. In some embodiments, a utility-based power source unit, a fuel-based power source unit, or a combination power source unit including both a utility power component and a fuel-based power component may be sized to provide a relatively small portion of the overall power being consumed by the grid, such as grid 104. For example power source unit 118 may be a 750 kilowatt power source unit. In this way the grid may not be overly dependent on any single power source to supply power to the grid.

FIG. 1B is a block and line diagram illustrating components of a node of a power distribution and cooling grid, wherein the node is connected to multiple transport elements of the power distribution and cooling grid, according to some embodiments. In some embodiments, node 130 illustrated in FIG. 1B may be a node 106 as illustrated in FIG. 1A. Also transport elements 132, 134, 136, and 138 may be transport elements 102 as illustrated in FIG. 1A.

As shown in FIG. 1B each of transport elements 132, 134, 136, and 138 include high-side electrical pathways 140, low-side electrical pathways 142, cooling fluid supply lines 144, and cooling fluid return lines 146. The electrical pathways (high and low) meet at respective node points 148, wherein a set of four high-side pathways, one from each transport element, meets at a node point 148, and a set of four low-side pathways, one from each transport element, meets at another respective node point 148. In a similar manner four cooling fluid supply lines, one from each respective transport element, meet at a respective manifold 150, and a set of four return lines meet at another respective manifold 150. As shown in more detail in FIG. 1C, electrical loads may be connect to high-side and low-side node points 148 to receive electrical power from a grid. Also, a cooling circuit for cooling heat producing components of an electrical load may be connected to both a supply manifold 150 and a return manifold 150 at a node 130.

In some embodiments, node 130 further includes isolation switches 152 and shut-off valves 154. In some embodiments, an isolation switch 152 or a shut-off valve 154 may be automatically operated to isolate a failed transport element. In some embodiments, an isolation switch 152, or a shut-off valve 154, may be a passive protection element, wherein an imbalance between a high-side and a low-side current or voltage, or a difference between supply and return pressures or flow rates causes the isolation switch or shut-off valve to automatically isolate a respective transport element.

Figure 1C:
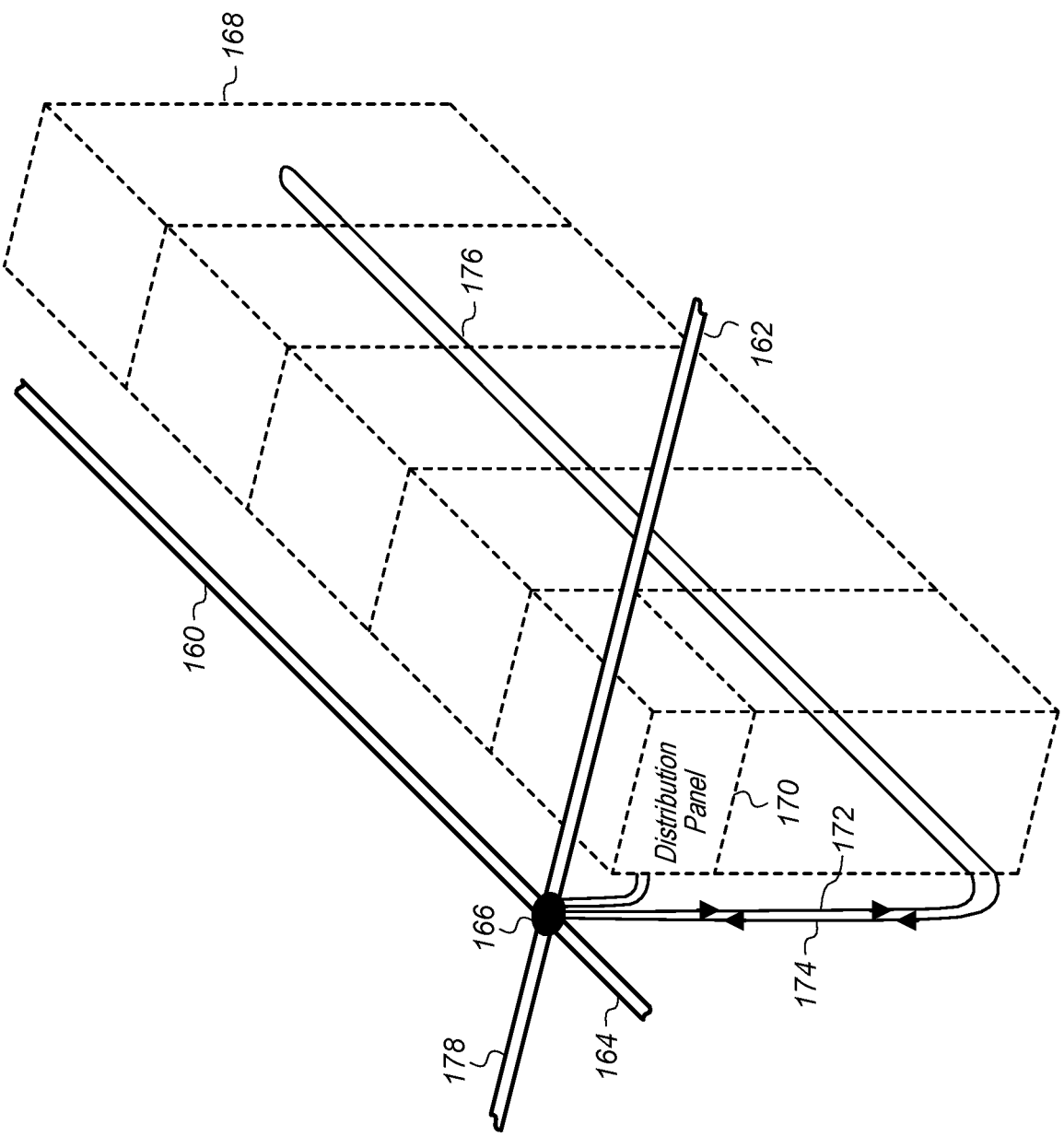
FIG. 1C is a perspective view of a block diagram illustrating a node at an intersection of transport elements, wherein the node is connected to power and cooling loads in a set of racks, according to some embodiments.

FIG. 1C is a perspective view of a block diagram illustrating a node at an intersection of transport elements, wherein the node is connected to power and cooling loads in a set of racks, according to some embodiments.

As discussed above, in some embodiments, electrical loads are connected to a node of a power distribution grid and cooling circuits for the electrical loads are connected to a node of an internal cooling grid. In some embodiments, the power distribution grid and the internal cooling grid may be combined into a common grid and both power and cooling connections may be made to the same node. For example, node 166 is connected to power distribution panel 170 that supplies power to electrical loads 168. Also, cooling circuit 176 is connected to node 166. Cooling circuit 176 includes a supply line 172 and a return line 174, each connected to a respective supply manifold and a respective return manifold of node 166. The cooling circuit 176 provides cooling to heat exchangers that remove heat from heat producing components included in electrical loads 168.

Figure 13:
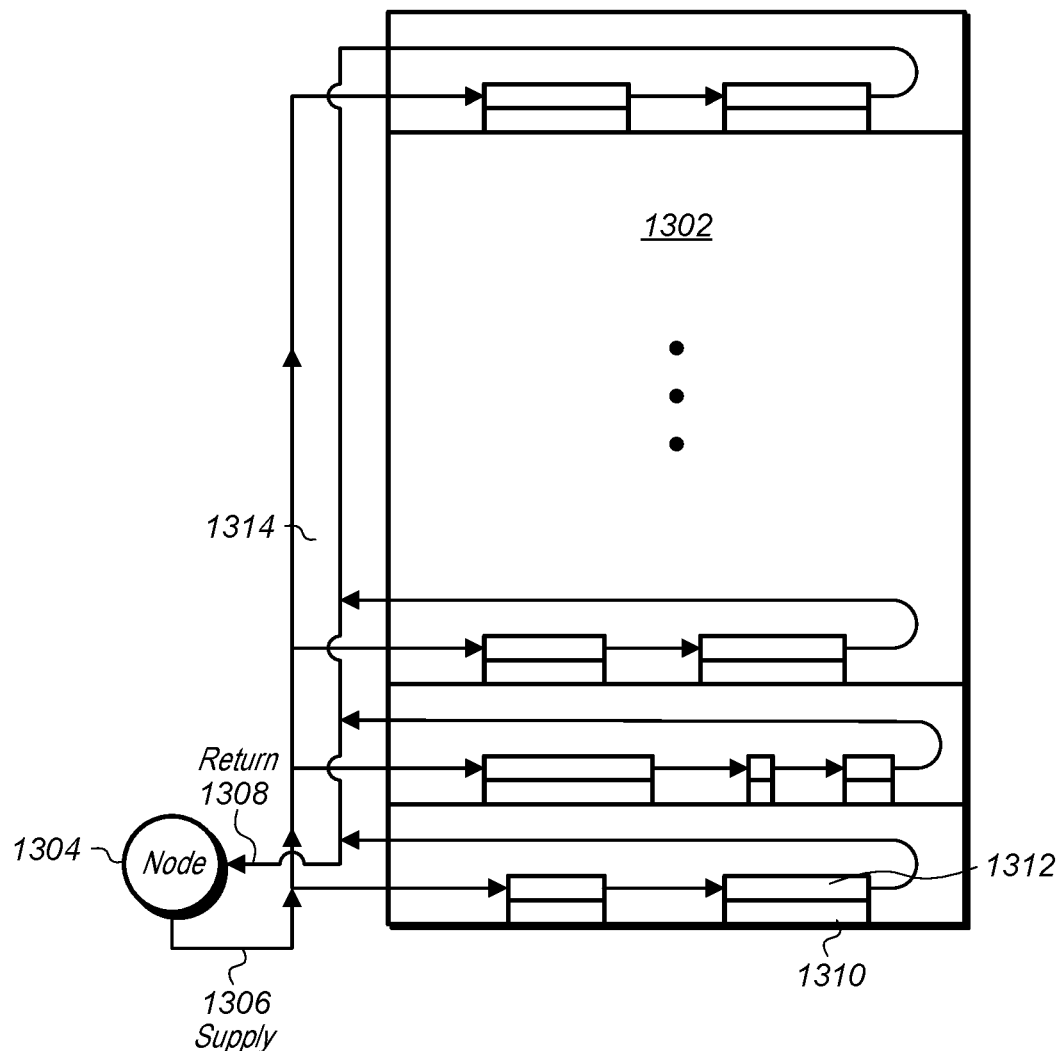
FIG. 13 illustrates liquid cooled heat producing components being cooled by a cooling fluid received from, and returned to, a cooling grid, via a node of the cooling grid, according to some embodiments.
Figure 14:
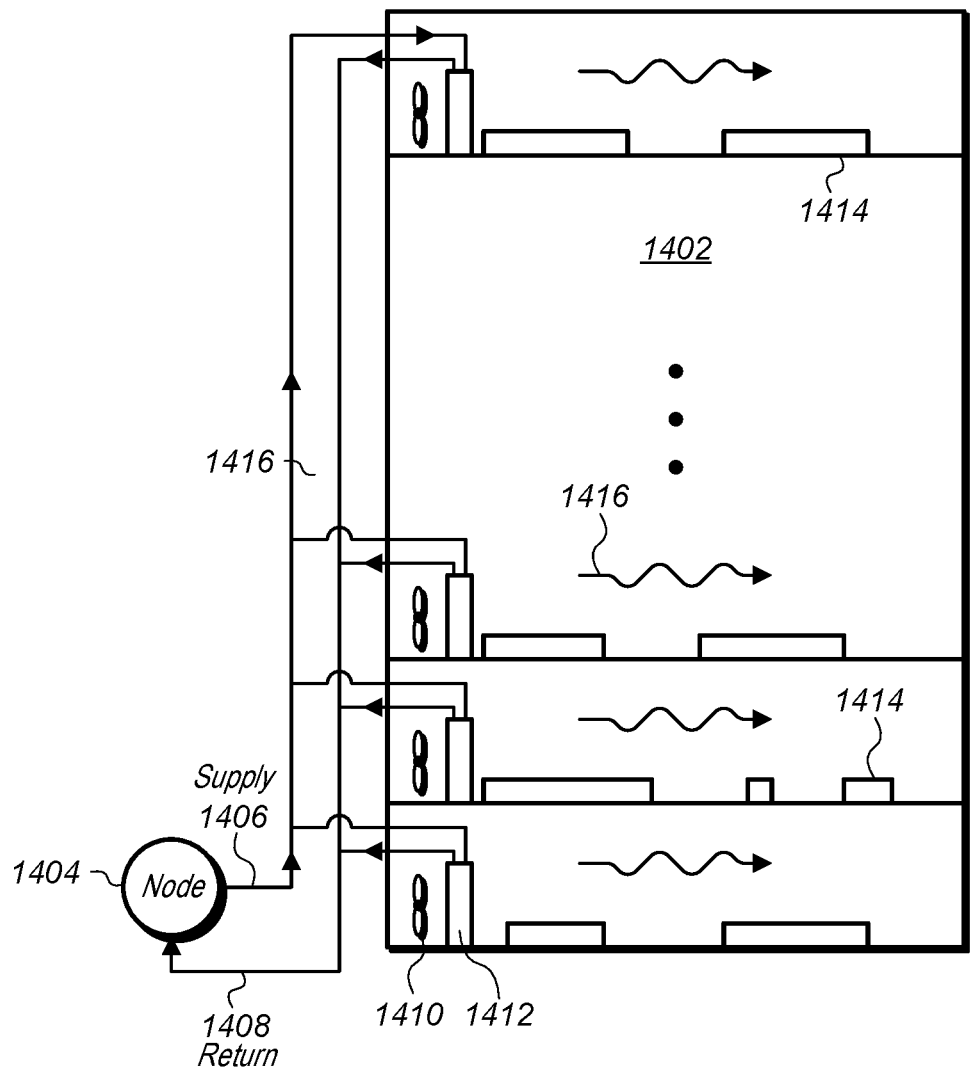
FIG. 14 illustrates air cooled heat producing components being cooled by a cooling fluid received from, and returned to, a cooling grid, via a node of the cooling grid, according to some embodiments.

As discussed in more detail in FIGS. 13 and 14, in some embodiments, liquid heat exchangers or liquid to air heat exchangers may connect to a cooling circuit, such as cooling circuit 176, and may cool heat producing components included in electrical loads, such as heat producing components of electrical loads 168. Also as shown in FIG. 1C, node 166 is located at the grid intersection of transport elements 160, 162, 164, and 178. Thus electrical power from any one of transport elements 160, 162, 164, or 178 may be supplied to distribution panel 170 via node 166. If one or more of transport elements 160, 162 164, or 178 is unavailable to supply electrical power to distribution panel 170 via node 166, the remaining ones of transport elements 160, 162 164, or 178 may supply electrical power to distribution panel 170 via node 166. In a similar manner, cooling fluid from any one of transport elements 160, 162, 164, or 178 may be supplied, via node 166, to cooling circuit 176 and return cooling fluid from cooling circuit 176 may be returned to any one of the transport elements 160, 162, 164, or 178 via node 166. If one or more of transport elements 160, 162 164, or 178 is unavailable to supply or accept cooling fluid to or from cooling circuit 176 via node 166, the remaining ones of transport elements 160, 162 164, or 178 may supply or accept cooling fluid from cooling circuit 176 via node 166.

Figure 1D:
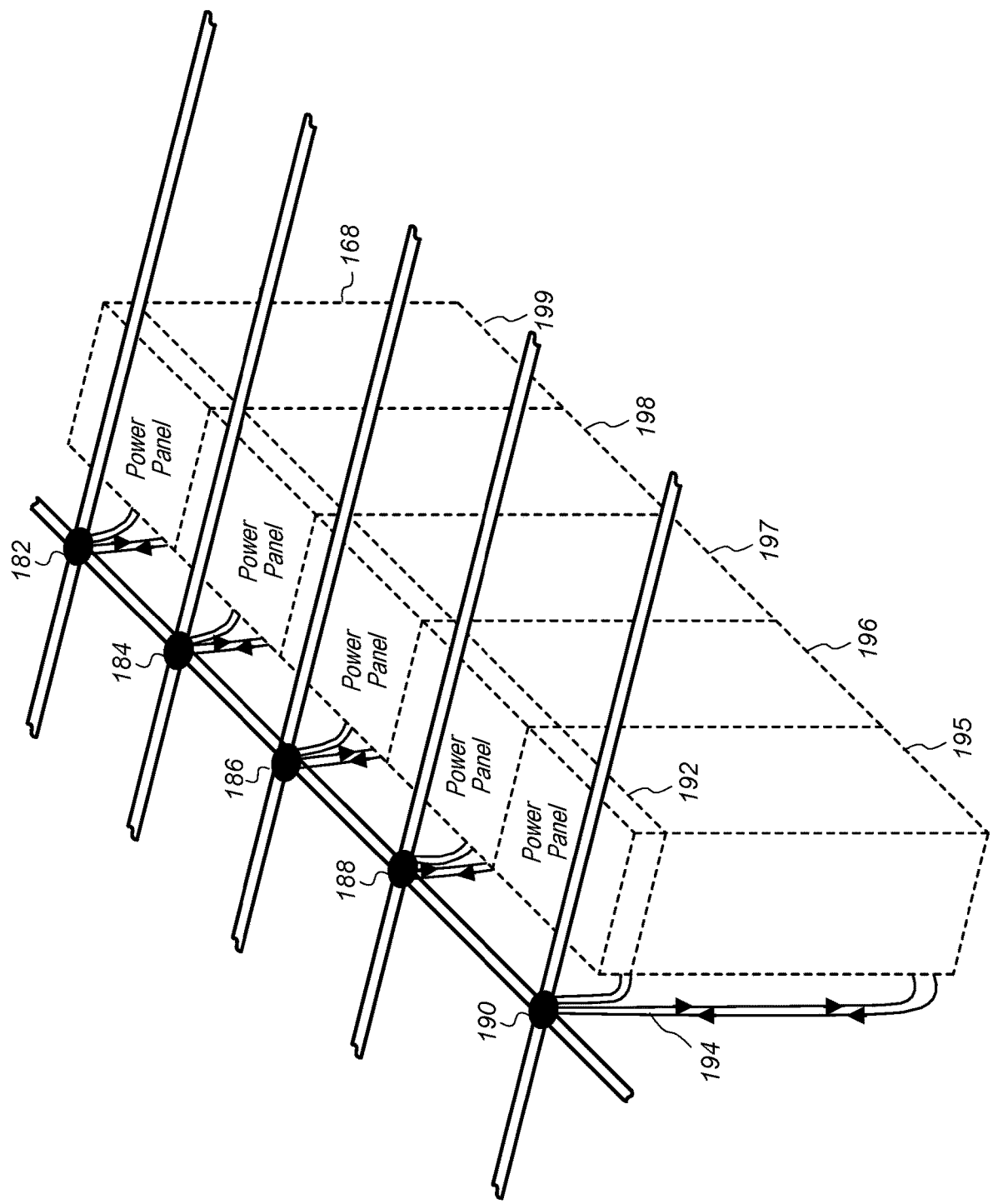
FIG. 1D is a perspective view of a block diagram illustrating multiple nodes at intersections of transport elements, wherein the nodes are connected to power and cooling loads in a set of racks, according to some embodiments.

FIG. 1D is a perspective view of a block diagram illustrating multiple nodes at intersections of transport elements, wherein the nodes are connected to power and cooling loads in a set of racks, according to some embodiments.

In some embodiments, a node of a power distribution grid, and/or internal cooling grid may be connected to a set of racks as shown in FIG. 1C, or may be connected to an individual rack as shown in FIG. 1D. For example, each of nodes 182, 184, 186, 188, and 190 is connected to a separate power panel 192 included in a separate one of racks 195, 196, 197, 198, and 199, each comprising electrical loads 168. Also, each of nodes 182, 184, 186, 188, and 190 are connected to a separate cooling circuit 194, wherein each of racks 195, 196, 197, 198, and 199 are cooled by separate ones of the cooling circuits 194.

Figure 2:
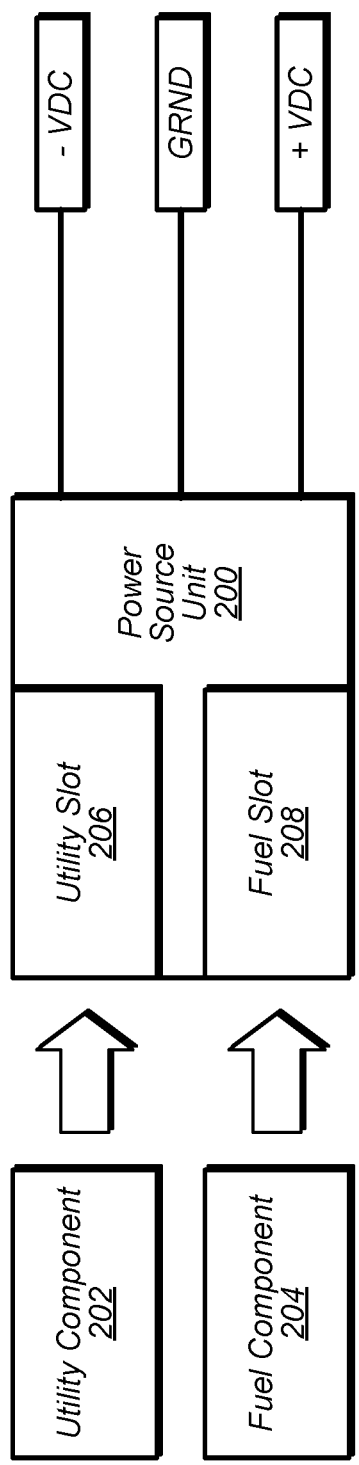
FIG. 2 illustrates an example power source unit that includes both a fuel-based power generation component and a utility-power feed based component, according to some embodiments.

FIG. 2 illustrates an example power source unit that includes both a fuel-based power generation component and a utility-power feed based component, according to some embodiments. For example, power source unit 118 illustrated in FIG. 1A, may be a power source unit similar to power source unit 200 illustrated in FIG. 2.

In some embodiments, a power source unit, such as power source unit 200, may be a skid-mounted unit configured to accept a utility power component 202 in a utility slot 206 and configured to accept a fuel-based power component 204 in a fuel slot 208. The power source unit may provide direct current (DC) power to a power distribution grid, such as grid 104. In some embodiments, the utility component 202 may include a rectifier and one or more transformers. The utility component 202 may be configured to receive low-voltage alternating current (AC) power from a utility power source and provide DC power to a power distribution grid, such as grid 104. In some embodiments, the fuel component 204 may include a diesel generator, or may include a quick-start multi-fuel turbine. For example the quick-start multi-fuel turbine may convert natural gas or another fuel into electrical power. In some embodiments, a power source unit 200 may include circuit protection and may supply isolated and regulated DC power to a power distribution grid, such as grid 104.

In some embodiments, utility component 202 and fuel-based component 204 may be configured to be installed in power source unit 200 manually, or with the assistance of a forklift or small crane. In some embodiments, power source unit 200 may be configured to be moved from one location (for example a pad, such as pad 124) to another location (such as a different pad) at a same or different facility, such as a data center.

Figure 3:
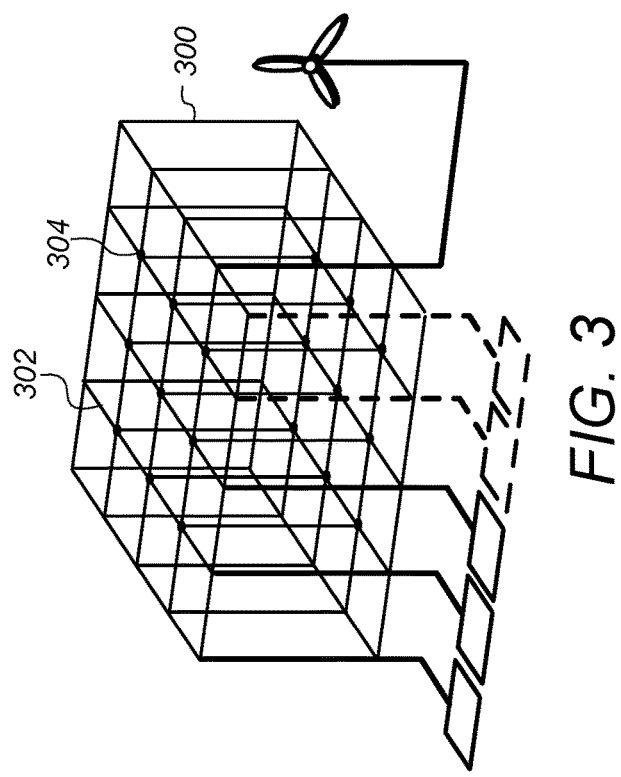
FIG. 3 illustrates an example three-dimensional power distribution and/or cooling grid, according to some embodiments.

In some embodiments, a power distribution and/or internal cooling grid, such as grid 104, may be configured according to multiple geometrical configurations. For example, in some embodiments, a grid may be a horizontal grid, as shown in FIG. 1A for grid 104, or may be a 3-D dimensional grid as shown in FIG. 3. In some embodiments, a grid may be vertical as shown in FIG. 4, or circular as shown in FIG. 5.

FIG. 3 illustrates an example three-dimensional power distribution and/or cooling grid, according to some embodiments. Grid 300 includes transport elements 302 and nodes 304 organized in a three-dimensional grid pattern. In some embodiments, respective ones of nodes 304 may be located at the intersection of 3, 4, 5, 6, or more transport elements. Each of the nodes may receive power and/or cooling fluid via any of the transport elements connected to the respective node and may supply power and cooling fluid to electrical loads and/or cooling circuits for heat producing components serviced by the respective nodes.

Figure 4:
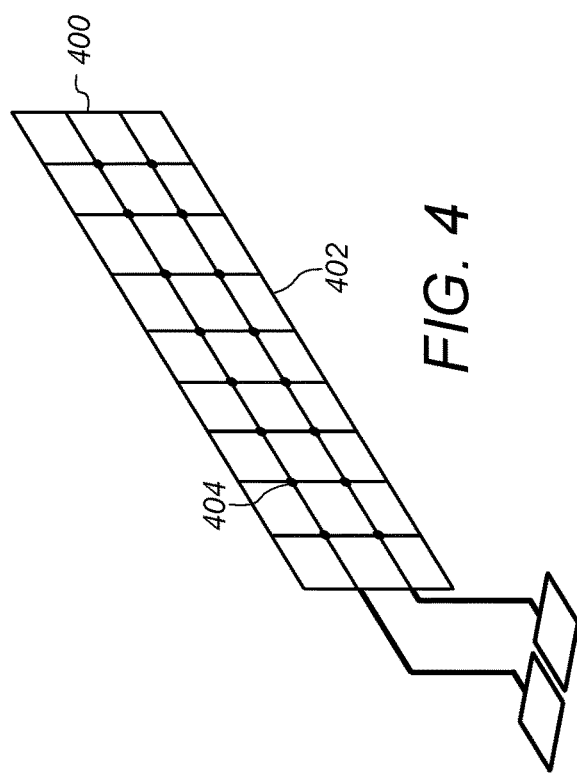
FIG. 4 illustrates an example vertical power distribution and/or cooling grid, according to some embodiments.

FIG. 4 illustrates an example vertical power distribution and/or cooling grid, according to some embodiments. Grid 400 is a vertical grid and includes transport elements 402 arranged in a vertical plane, wherein nodes 404 are located at intersections of the transport elements 402.

Figure 5:
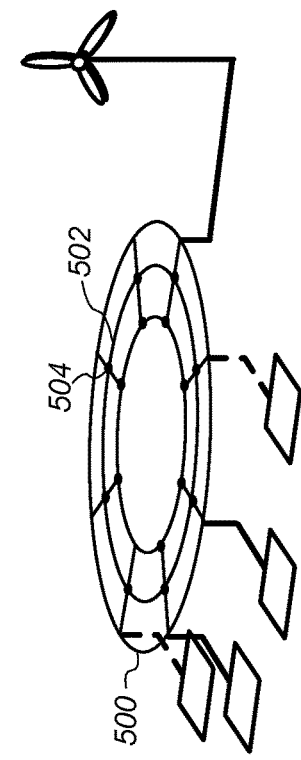
FIG. 5 illustrates an example circular power distribution and/or cooling grid, according to some embodiments.

FIG. 5 illustrates an example circular power distribution and/or cooling grid, according to some embodiments. Grid 500 is a circular grid with semi-circular shaped transport elements 502 and nodes 504. In some embodiments, a circular grid 500 may include transport elements arranged in concentric circles with radial transport elements connecting successive bands of the concentric semi-circular transport elements FIG. 6A illustrates a top view of a power distribution and/or cooling grid and multiple types of power source units connected to the grid along a periphery of the grid, according to some embodiments.

In some embodiments, power source units are connected to a power distribution grid on multiple sides of the grid. For example data center 600 includes grid 602 comprising transport elements 604 and nodes 606. Fuel-based power source unit 608, utility-based power source unit 610, geo-thermal-based power source unit 614, wind-based power source unit 616, solar-based power source unit 618, and other renewable power source unit 612 are connected on a first side of the grid 602. Additionally, similar sets of power source units are also connected to the grid 602 on three other sides of the grid 602, e.g. a top side, a bottom side, and a left side of the grid 602.

In some embodiments, a power grid controller (as discussed in more detail in FIG. 8) may select power source units to be activated or de-activated based on a proximity of the power source units to electrical loads that will be consuming power from the power source units. For example if electrical loading of grid 602 is unbalanced such that there is a greater amount of electrical power being consumed via nodes 606 in an upper right hand area of the grid 602, a power distribution grid controller may activate power source units on the top side of the grid 602 and/or on the right side of the grid 602. If an electrical loading pattern of the grid 602 changes such that there is a greater amount of electrical power being consumed via nodes 606 in a lower left hand area of the grid 602, the power distribution grid controller may de-activate one or more power source units on the top or right side of the grid 602 and instead activate one or more power source units on the left or bottom side of the grid 602.

In some embodiments, a combination of power source units supplying power to an internal grid of a data center, such as grid 602, may be adjusted in response to one or more failures of transport elements and/or nodes of the grid. For example, a failed transport element on a first side of a grid may block a power path from a power source unit to a load or may unevenly concentrate power distribution across the grid onto a limited number of transport elements. In response, a power distribution grid controller may adjust power source units that supply power to the grid such that the power is supplied from another side of the grid that does not require the power to flow across the failed transport element and/or that reduces the concentrated distribution of power across the limited number of transport elements.

FIG. 6B illustrates a high-ohmic ground path that may be included in a node of a power distribution grid, according to some embodiments. For example high-ohmic ground path 620 may be included in any of nodes 606. High-ohmic ground path 620 includes a ground tap 626 electrically coupled to a high-side electrical pathway via high resistance resistor 622 and electrically coupled to a low-side electrical pathway via high resistance resistor 624. In case of a ground fault in one of the electrical loads, nodes, or transport elements, high-ohmic ground path 620 provides an alternate path to ground thus reducing the effects of the ground fault and protecting electrical loads, transport elements, and nodes from catastrophic failure during a ground fault.

Figure 7:
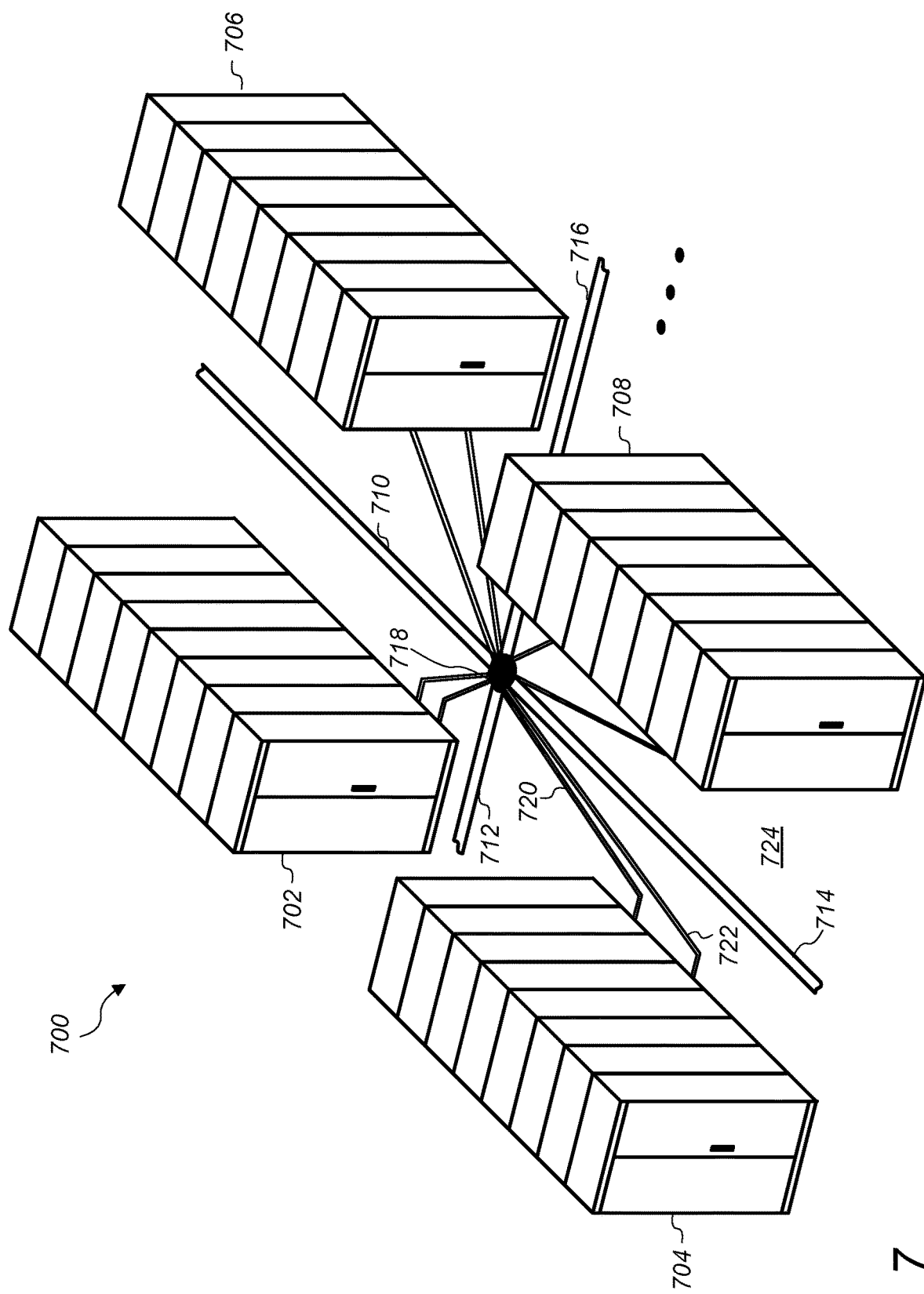
FIG. 7 illustrates a perspective view of shipping container-based modular data center units coupled to a node of a power distribution and/or cooling grid, according to some embodiments.

FIG. 7 illustrates a perspective view of shipping container-based modular data center units coupled to a node of a power distribution and/or cooling grid, according to some embodiments.

In some embodiments, a facility includes a slab or ground area and a cluster of containerized data centers, such as computing and networking equipment mounted in an ISO shipping container or other suitable shippable container. A power distribution and/or cooling grid may be constructed around the containerized data centers to provide power support and cooling support to the containerized data centers. The power distribution and/or cooing grid may function in a similar manner as described above in regard to grid 104. However, instead of supplying power and cooling support to racks or sets of racks in a data center building, the grid may supply power and cooling support to containerized data center modules in an open area or a warehouse building.

For example facility 700 includes floor 724 and containerized data center modules 702, 704, 706, and 708 mounted on the floor 724. Additionally, transport elements 710, 712, 714, and 716 are mounted on the floor 724 and are connected to node 718, which is also mounted on floor 724. In some embodiments, transport elements 710, 712, 714, and 716 and node 718 may be mounted in an elevated position. Each of the containerized data center modules is connected to node 718 to receive power and is also connected to node 718 to receive (and return) cooling fluid. For example, each of containerized data center modules 702, 704, 706, and 708 are connected to node 718 via power connections 722 and cooling supply and return connections 720.

Figure 8:
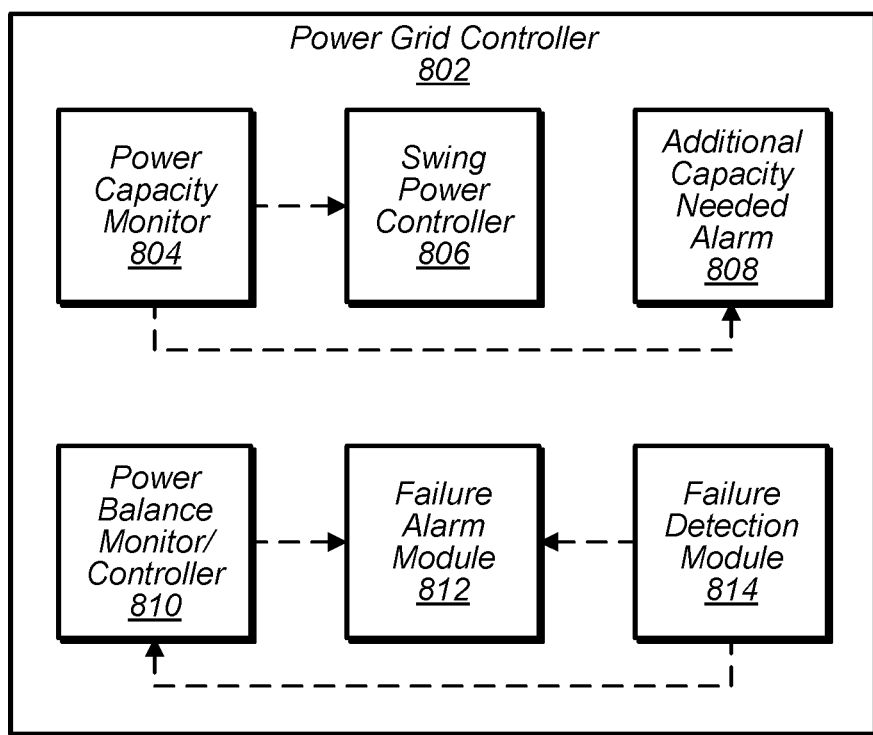
FIG. 8 illustrates a block diagram of a power distribution grid controller, according to some embodiments.

FIG. 8 illustrates a block diagram of a power distribution grid controller, according to some embodiments.

Power grid controller 802 includes power capacity monitor 804, swing power controller 806, additional capacity needed alarm 808, power balance monitor/controller 810, failure alarm module 812, and failure detection module 814.

In some embodiments, power capacity monitor 804 monitors overall power consumption versus current power capacity of power source units connected to a grid, such as any of the power distribution grids described herein. The power capacity monitor 804 may determine whether or not one or more power source units need to be activated or de-activated in order to better match power capacity to current power consumption. The power capacity monitor 804 may instruct swing power controller 806, to start-up, or shut-down, one or more power source units in order to better match power consumption and power capacity. In some embodiments, a swing power controller 806 may preferentially activate renewable power source units or otherwise configure the renewable power source units to provide electrical power to the grid before activating non-renewable power source units. Also, swing power controller 806 may prioritize utility power source units or components over fuel-based power source units or components. In some embodiments, a power capacity monitor and a swing power controller may collectively function to control a baseline amount of power being consumed by a power distribution grid to be fed from renewable and/or utility power sources, and cause peak power during consumption spikes to be fed from a fuel-based power source.

Power capacity monitor 804 may also monitor overall trends in power consumption and cause additional capacity needed alarm 808 to be activated if the overall trends indicate that an additional power source unit needs to be connected to the power distribution grid to better match power capacity to power consumption. For example, if a power trend indicates that an increasing amount of power is being provided by fuel-based power source modules because renewable based power source modules do not have sufficient capacity to meet current demand, a power capacity monitor 804 may determine that additional renewable power source units need to be connected to a power distribution grid and may alert facility personnel of this situation via additional capacity needed alarm 808.

Power balance monitor/controller 810 may monitor power consumption density across a grid. For example, power balance monitor/controller 810 may monitor if more power is being consumed in a particular area of the grid as compared to other areas of the grid. Also, power balance monitor/controller 810 may monitor current flow through respective transport elements and/or nodes of the grid. The power balance monitor/controller 810 may activate and/or de-activate power source units on different sides of the grid to better balance power flow through the grid. In some embodiments, a power balance monitor/controller 810 may work with a swing power controller, such as swing power controller 806, to activate and/or de-activate power source units on different sides of a grid. Also, failure detection module 814 may detect failed transport elements and report the failure of one or more transport elements to power balance monitor/controller 810 in order to better balance the grid. In some embodiments, power balance monitor/controller 810 may report imbalance conditions, wherein there is not a sufficient quantity of power source units on different sides of the grid to balance the grid via failure alarm module 812. Also, failure detection module 814 may report failed transport elements via failure alarm module 812.

In some embodiments, any of the power distribution grids, described herein may include a power grid controller, such as power grid controller 802.

Figure 9:
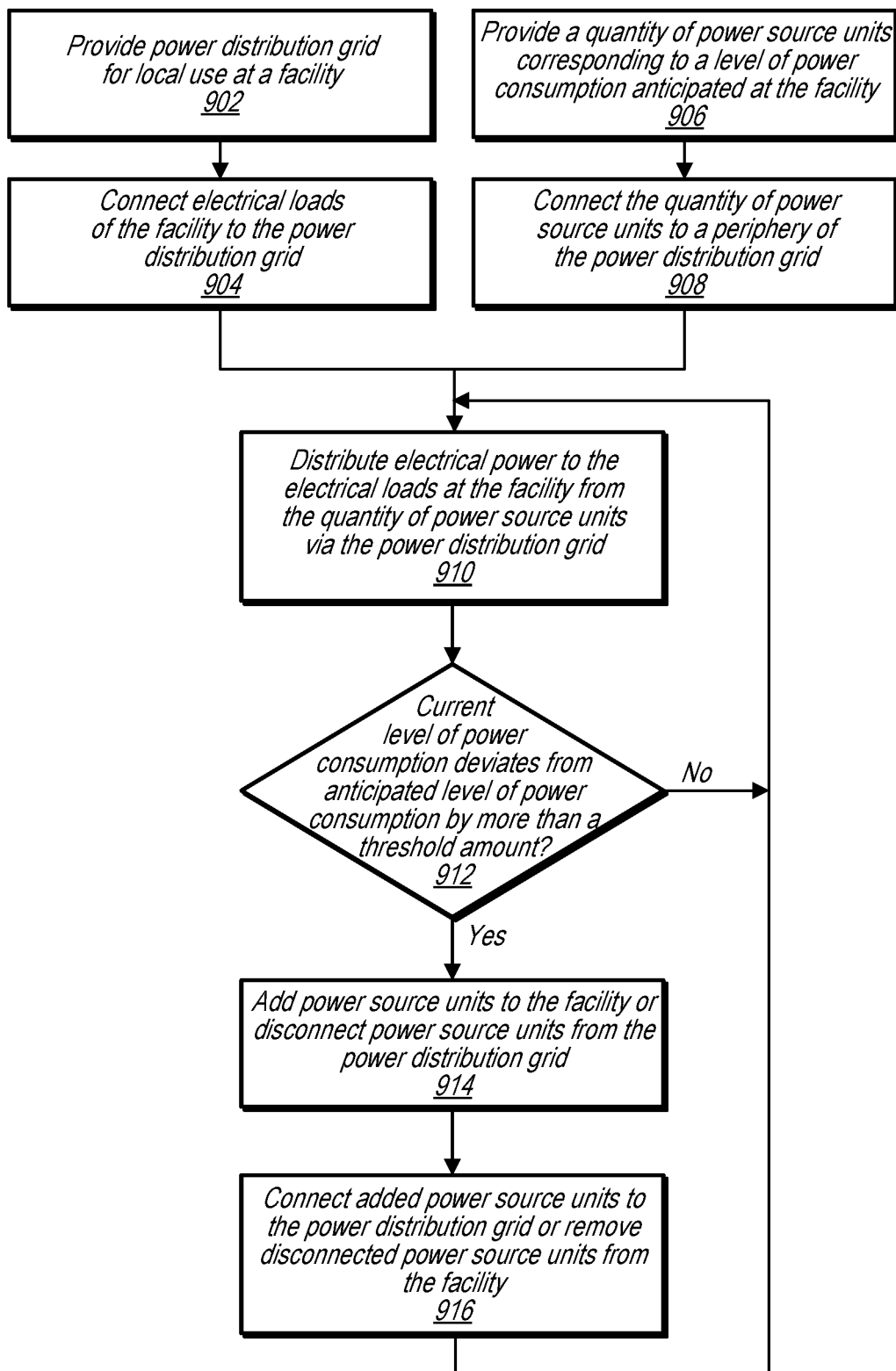
FIG. 9 illustrates a high-level flowchart for providing a power distribution grid at a facility and adjusting capacity of the power distribution grid, according to some embodiments.

FIG. 9 illustrates a high-level flowchart for providing a power distribution grid at a facility and adjusting capacity of the power distribution grid, according to some embodiments.

At 902, a power distribution grid, such as grid 104, is provided for local use at a facility, such as a data center. At 904, electrical loads at the facility, such as computing and/or data storage devices, are connected to the power distribution grid. At 906, a quantity of power source units corresponding to a level of power consumption anticipated at the facility is provided at the facility. At 908, the power source units are connected to the power distribution grid along a periphery of the grid. In some embodiments, 902, 904, 906, and 908 may be performed concurrently.

At 910, electrical power from the power source units connected to the internal power distribution grid in the facility (e.g. data center) is distributed to the electrical loads in the facility connected to the internal power distribution grid in the facility. The internal power distribution grid includes transport elements and nodes connected at intersections of the transport elements, wherein each node receives electrical power from more than two transport elements.

At 912, it is determined if a current level of power consumption of the electrical loads connected to the power distribution grid deviates from the anticipated level of power consumption (that was used to determine the quantity of power source units) by more than a threshold amount. If the current level of power consumption does not deviate from the anticipated level of power consumption by more than the threshold amount, the process reverts to 910 and electrical power is distributed to the electrical loads from the current quantity of power source units connected to the power distribution grid. In some embodiments 912 may be performed by a power capacity monitor of a power grid controller, such as power capacity monitor 804 of power grid controller 802.

If the current level of power consumption deviates from the anticipated level of power consumption by more than the threshold amount, at 914, one or more additional power source units are provided at the facility and, at 916, the additional power source units are connected to the power distribution grid while power continues to be provided to the electrical loads connected to the power distribution grid. Conversely, if the current level of power consumption deviates from the anticipated level of power consumption by more than a threshold amount in the other direction (e.g. current power consumption is considerably less than the anticipated level of power consumption), one or more of the power source units are disconnected from the power distribution grid at 914 and removed from the facility at 916, for example for re-use at another facility.

Figure 10:
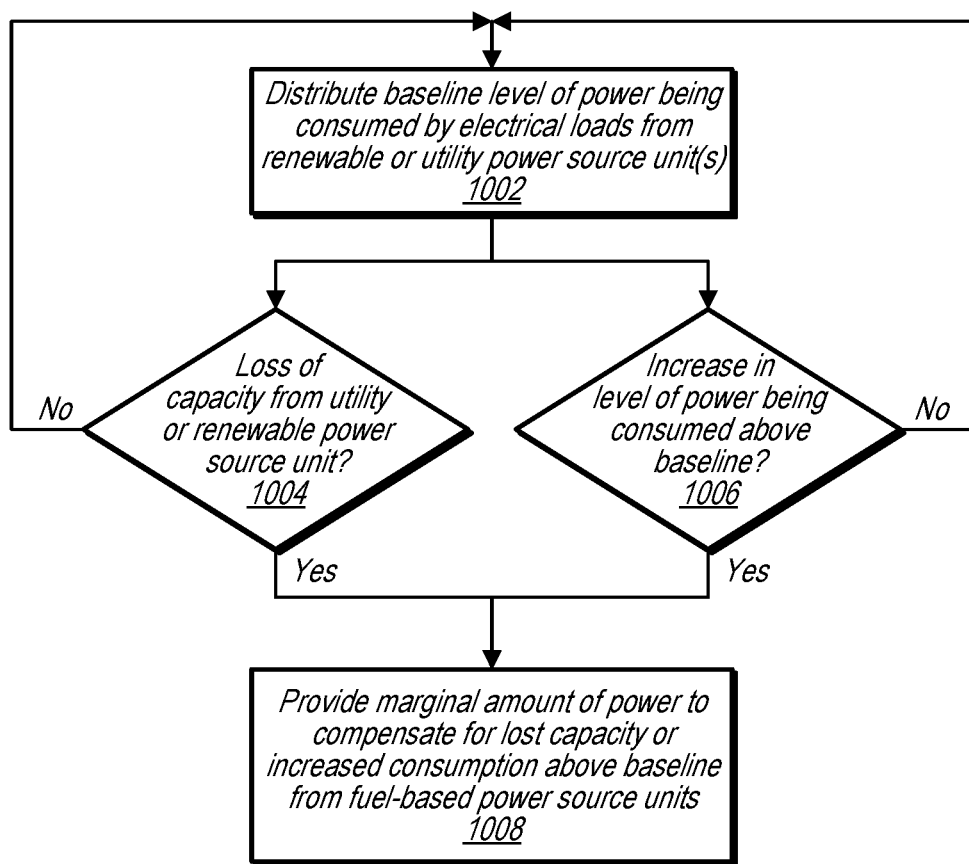
FIG. 10 illustrates a high-level flowchart for distributing electrical power to loads at a facility via a power distribution grid, according to some embodiments.

FIG. 10 illustrates a high-level flowchart for distributing electrical power to loads at a facility via a power distribution grid, according to some embodiments.

In some embodiments, power source units are managed such that power is preferentially provided from renewable and/or utility power source units when available. For example, at 1002, a baseline level of power consumed by the electrical loads is distributed to the electrical loads via the power distribution grid from renewable or utility power source units. For example a baseline amount of power may be a steady state amount of power the electrical loads consume under normal operating conditions.

At 1004, it is determined whether there has been a loss of capacity from the utility or renewable power source units. For example, a solar-based power source unit may produce less power when the sun is not shining or is blocked. As another example, a wind-based power source unit may produce less power when the wind is not blowing. Additionally or alternatively, a renewable power source unit or a utility power source unit may fail, causing a loss of power capacity. If there is not a loss of capacity the baseline amount of power continues to be provided by renewable and/or utility power source units. If there is a loss of capacity, at 1008, a marginal amount of power to make up for the loss of capacity may be provided to the power distribution grid from one or more of the fuel-based power source units connected to the power distribution grid.

At 1006, it is determined whether there has been an increase in power being consumed by the electrical loads above the baseline amount by more than a threshold amount. If not, the power distribution grid continues to distribute power received from the renewable and/or utility power source units connected to the power distribution grid. If there has been an increase in power being consumed the electrical loads above the baseline amount, a marginal amount of power to meet the increased power demand is provided to the power distribution grid from one or more fuel-based power source units connected to the power distribution grid.

In some embodiments, there may not be a utility power source unit connected to the power distribution grid and the baseline amount of power may be provided by renewable power source units alone, wherein marginal amounts of power are provided to the power distribution grid from fuel-based power source units to compensate in shortfalls of power provided by the renewable power source units.

In some embodiments, distributing electrical power to loads at a facility via a power distribution grid as described in FIG. 10 may be managed by a power balance monitor/controller of a power grid controller, such as power balance monitor/controller 810 of power grid controller 802.

Figure 11:
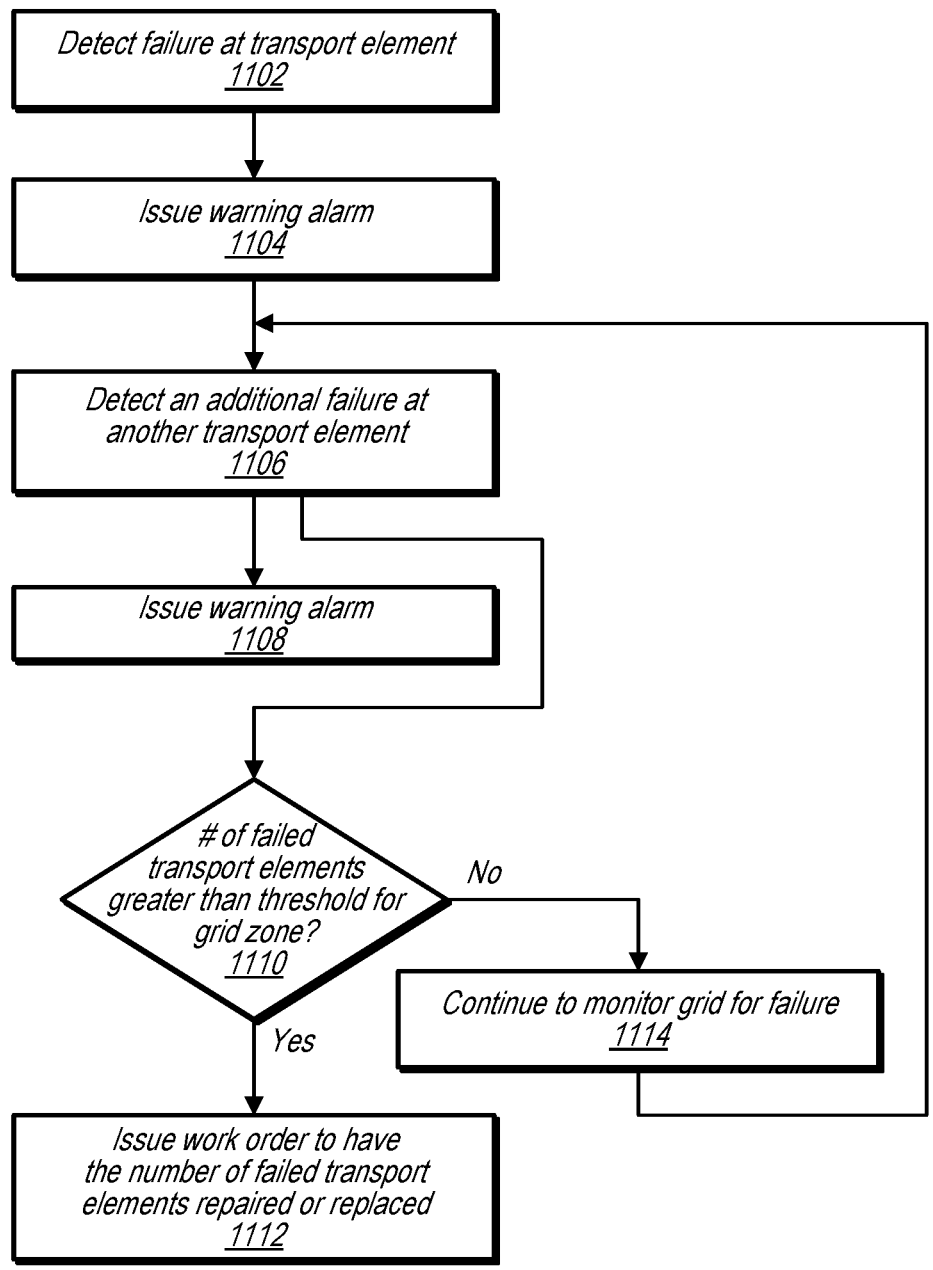
FIG. 11 illustrates a high-level flowchart for monitoring and/or responding to failed transport elements of a power distribution and/or cooling grid, according to some embodiments.

FIG. 11 illustrates a high-level flowchart for monitoring and/or responding to failed transport elements of a power distribution and/or cooling grid, according to some embodiments.

At 1102 a failure at a transport element is detected. The failure may be a short in the electrical wiring of the transport element or a leak in one or more of the cooling fluid lines of the transport element. At 1104, a warning alarm is issued alerting facility personnel of the failure of the transport element.

At 1106, another failure at another transport element of the same grid is detected. At 1108, another warning alarm is issued and at 1110 it is determined whether the total number of failed transport elements for the grid or for a sector of the grid exceeds a threshold number of allowable failed transport elements. If the threshold has not been reached, at 1114, the system continues to monitor the grid for failures.

If the threshold has been reached, at 1112, the system (e.g. a power distribution controller and/or failure alarm module) issues a work order to have the number of failed transport elements repaired or replaced. Because each node receives power from more than two transport elements, a power distribution grid in a data center or other facility can tolerate transport element failures without needing to immediately repair the failed transport elements. For example, a node connected to four transport elements could be connected to two failed transport elements and still also be connected to an additional two non-failed transport elements that provide redundant power support. In a grid with more transport element connections at a node, such as a 3-D grid, even more transport element failures may be tolerated. Also, accumulating transport element failures before performing maintenance may improve maintenance efficiency.

In some embodiments, the monitoring and/or responding to failed transport elements of a power distribution and/or cooling grid as described in FIG. 11 may be performed by a failure detection module and or failure alarm module of a power grid controller, such as failure detection module 814 and failure alarm module 812 of power grid controller 802.

Internal Cooling Grid

As discussed above, in some embodiments, an internal grid within a facility, may include transport elements and nodes that provide power to connected loads, may include transport elements and nodes that provide cooling support to connected cooling circuits that cool heat producing elements in the electric loads, or may include transport elements and nodes that provide both power and cooling support to connected electrical loads. The description of FIGS. 12-18, below, discusses cooling support provided by an internal grid in a facility in more detail. However, it should be understood that the embodiments described below in regard to FIGS. 12-18 in some embodiments, may be combined with any of the embodiments described above in regard to FIGS. 2-11. Moreover, as discussed above, grid 104 described if FIGS. 1-4 provides both power support and cooling support to connected electrical loads.

Figure 12:
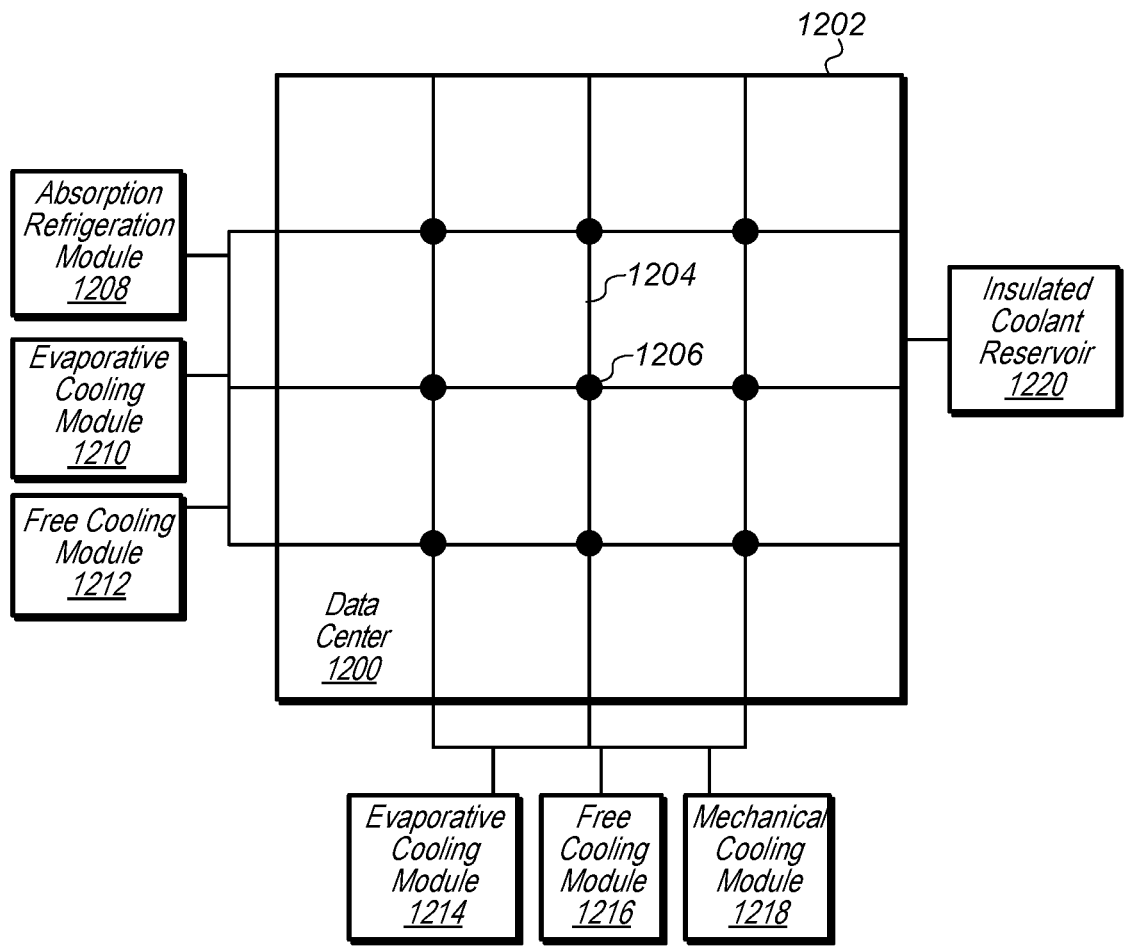
FIG. 12 illustrates a top view of a cooling grid that includes multiple types of heat rejection units coupled to a periphery of the cooling grid, according to some embodiments.

FIG. 12 illustrates a top view of a cooling grid that includes multiple types of heat rejection units coupled to a periphery of the cooling grid, according to some embodiments.

In some embodiments, a power distribution and/or internal cooling grid may be connected to heat rejection units on a plurality of sides of the grid. This may allow for cooling to be balanced such that for sections of the grid that reject more waste heat, more heat rejections units are activated to reject the waste heat.

In some embodiments, a power distribution and/or internal cooling grid may be connected to an insulated coolant reservoir that acts as a buffer or capacitor for the internal cooling grid, wherein when there is excess cooling capacity a temperature of a mass of water in the insulated reservoir is lowered, and when there is a lack of cooling capacity, heat rejected into the cooling grid is absorbed by the mass of water in the insulated reservoir.

In some embodiments, cooling grid 1202 includes transport elements 1204 arranged in a grid pattern and nodes 1206 connected to the transport elements 1204 at intersection locations of the transport elements 1204. In some embodiments, the cooling grid is internal to a facility, such as data center 1200. For example, a cooling grid 1202 may be located within walls of a data center building 1200.

In some embodiments, various types of heat rejection units may be connected to cooling grid 1202 on a periphery of the cooling grid 1202. In some embodiments, the heat rejection units may be located at a data center site for data center 1200, but may be located outside of the walls of a data center building 1200. In some embodiments, evaporative cooling module 1214, free-cooling module 1216, and mechanical cooling module 1218 may be located on a first (e.g. bottom) side of cooling grid 1202 and absorption refrigeration module 1208, evaporative cooling module 1210, and free-cooling module 1212, may be located on another (e.g. left) side of the cooling grid 1202. In some embodiments, insulated coolant reservoir 1220 may be connected to cooling grid 1202. In some embodiments, cooling fluid flowing through cooling grid 1202 may flow through transport elements 1204 and nodes 1206 to heater exchangers connected to the nodes 1206 via one or more cooling circuits. Also, the cooling fluid flowing through cooling grid 1202 may flow through heat rejection units connected to the cooling grid, such as absorption refrigeration module 1208, evaporative cooling module 1210, free-cooling module 1212, evaporative cooling module 1214, free-cooling module 1216, and mechanical cooling module 1218. In some embodiments, the cooling fluid flowing through cooling grid 1202 may flow through insulated coolant reservoir 1220. For example, as the cooling fluid flows through the insulated coolant reservoir 1220, at least some of the contents of the tank may be turned over causing a temperature of the mass of coolant in the insulated coolant reservoir to adjust based on the temperature of the cooling fluid flowing through the cooling grid 1202. In some embodiments, insulated coolant reservoir 1220 may maintain a constant level as cooling fluid flows through the tank.

In some embodiments, the heat rejection units may be modular units and may be moved by a forklift and may include standardized connectors configured to connect to standard connectors on the periphery of the cooling grid 1202.

FIG. 13 illustrates liquid cooled heat producing components being cooled by a cooling fluid received from, and returned to, a cooling grid, via a node of the cooling grid, according to some embodiments.

In some embodiments, a cooling circuit connected to a node of cooling grid may flow cooling fluid through one or more direct heat exchangers mounted on heat producing components of electrical loads. For example the heat exchangers may be cold-plate type heat exchangers, a heat sink, an immersive cooling-type heat exchanger, or other types of heat exchangers that exchanger heat between a flowing cooling fluid and heat producing component of an electrical load. In some embodiments, any of the cooling circuits described herein may flow cooling fluid through direct heat exchangers as described in regard to FIG. 13.

In some embodiments, a cooling circuit 1314 flows cooling fluid from a supply manifold of node 1304 (which may be connected to four or more transport elements) via supply line 1306 to direct heat exchangers 1312, which remove heat from heat producing components 1310 mounted in rack 1302. Cooling fluid that has absorbed heat removed from heat producing components 1310 via heat exchangers 1312 may flow back to a return manifold of node 1304 (which may be connected to four or more transport elements) via return line 1308.

In some embodiments, in addition to or in place of a direct heat exchanger as described in regard to FIG. 12, a rack or electrical load may include an liquid to air heat exchanger that transfer heat between air and a liquid flowing through the liquid to air heat exchanger. The cooled air may then be directed across heat producing components of electrical loads to remove waste heat from the electrical loads.

For example, FIG. 14 illustrates air cooled heat producing components being cooled by a cooling fluid received from, and returned to, a cooling grid, via a node of the cooling grid, according to some embodiments.

In some embodiments, a cooling circuit 1416 flows cooling fluid from a supply manifold of node 1404 (which may be connected to four or more transport elements) via supply line 1406 to liquid to air heat exchangers 1412, which remove heat from air 1416 direct to heat producing components 1414 mounted in rack 1402 via fans 1410. Cooling fluid that has absorbed heat removed from air 1416 via liquid to air heat exchangers 1412 may flow back to a return manifold of node 1404 (which may be connected to four or more transport elements) via return line 1408. In some embodiments, wherein the electrical loads are rack-mounted servers, each server may include a separate liquid to air heat exchanger. Also, in some embodiments a single liquid to air heat exchanger may cool air supplied to multiple electrical loads mounted in a rack.

Figure 15:
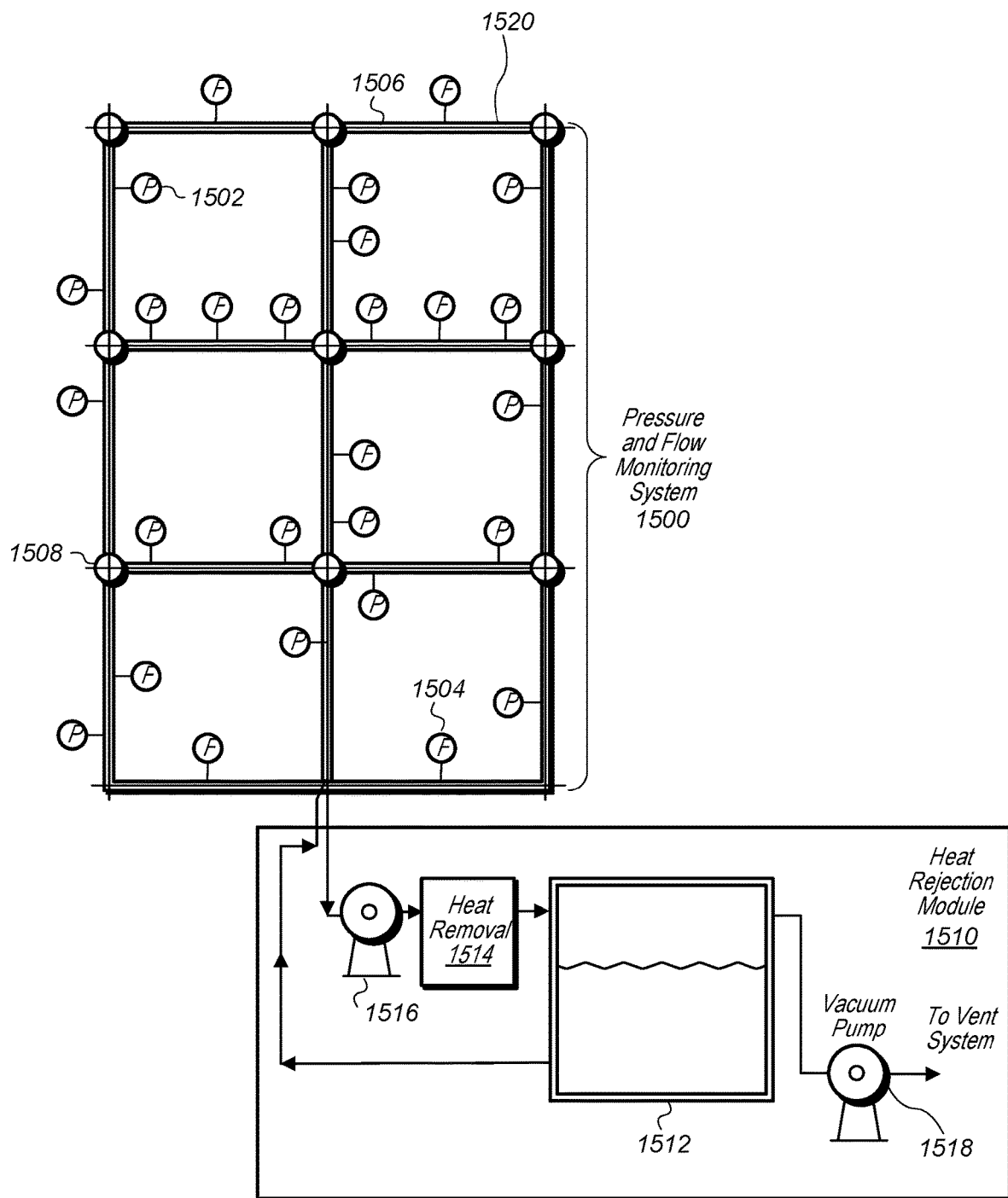
FIG. 15 illustrates an example configuration of a cooling grid that operates at a pressure below atmospheric pressure, according to some embodiments.

FIG. 15 illustrates an example configuration of a cooling grid that operates at a pressure below atmospheric pressure, according to some embodiments.

In some embodiments, a cooling grid, such as any of the cooling grids described herein, may operate under a vacuum. For example a pressure within the cooling supply lines and/or cooling return lines of the cooling grid may be less than an atmospheric pressure at the facility in which the cooling grid is located. In some embodiments, the pressure may be less than 760 mmHg. In some embodiments, operating a cooling grid at a pressure below one atmosphere may prevent cooling fluid from leaking out of the cooling grid into the electrical loads. For example, in the case of a leaking transport element or node, air may leak into the supply or return lines of the cooling grid instead of cooling fluid leaking out of the supply or return lines of the cooling grid.

In some embodiments, an array of pressure and/or flow sensors may be distributed throughout a cooling grid to measure respective pressures of cooling fluid supply lines and return lines and to also measure flow rates through these lines. A pressure and flow monitoring system may determine flow imbalances through the system and/or leaks in the system based on measured pressures and flows.

For example, cooling grid 1520 includes transport elements 1506 arranged in a grid pattern and nodes 1508 at intersections of the grid pattern. Pressure transmitters 1502 are connected to respective ones of the transport elements and measure respective supply and return pressures of cooling fluid flowing through the respective transport elements. Also, flow transmitters 1504 are connected to respective ones of the transport elements and measure respective supply and return flow rates of cooling fluid flowing through the respective transport elements. In some embodiments, a pressure and flow monitoring system 1500 may receive pressure and flow measurements from the pressure transmitters 1502 and flow transmitters 1504. In some embodiments, a pressure and flow monitoring system may be part of a failure/leak detection module of a cooling grid controller, as described in more detail in regard to FIG. 16. Also, in some embodiments, pressure and flow measurements received from pressure transmitters 1502 and flow transmitters 1504 may be communicated to a flow/pressure controller of a cooling grid controller, as described in more detail in regard to FIG. 16.

In some embodiments, any of the heat rejection units described herein may be modular heat rejection units, such as modular heat rejection unit 1510 illustrated in FIG. 15. Modular heat rejection unit 1510 includes a reservoir 1512 that provides a hold up location for cooling fluid to be drawn from when being pulled into cooling grid 1520. Modular heat rejection module 1510 also includes a pump 1516 which draws heated cooling fluid out of cooling grid 1520 and causes fresh (or cooled) cooling fluid to be drawn out of reservoir 1512. Heat rejection module 1510 also includes a heat removal unit 1514 between the discharge of pump 1516 and reservoir 1512. In some embodiments, pump 1516 may cause the heated cooling fluid drawn out of cooling grid 1520 to flow through heat removal unit 1516 and into reservoir 1512. Heat may be removed from the cooling fluid as it flows through heat removal unit 1514 and reservoir 1512 may be heavily insulated such that the cooling fluid cooled by heat removal unit 1514 remains cool while in reservoir 1512. In some embodiments, hear removal unit 1514 may be an evaporative cooler, free-cooling module, mechanical chiller, absorption refrigeration unit, geo-thermal cooler, or other type of heat rejection device. In some embodiments, a modular heat rejection module may optionally include a vacuum pump 1518 to remove air from reservoir 1512 and to ensure a pressure of the cooling fluid flowing through the cooling grid 1520 remains below one atmosphere. Also, some embodiments a flow transmitter (not shown) may be located on the discharge side of the vacuum pump to measure an amount of air that is being removed from the cooling grid.

In some embodiments, the supply lines, return lines, and pump 1516 may be sized such that a supply pressure and return pressure of the respective supply lines and cooling lines remains consistent while the cooling grid 120 is flowing a cooling fluid through the cooling grid. For example, the diameter of the supply lines and return lines may be sufficiently large such that pressure losses due to fluid flow are negligible. Also pressure losses due to piping junctions such as at nodes and manifolds within the nodes may be negligible by selecting relatively large diameter manifolds and fittings.

Figure 16:
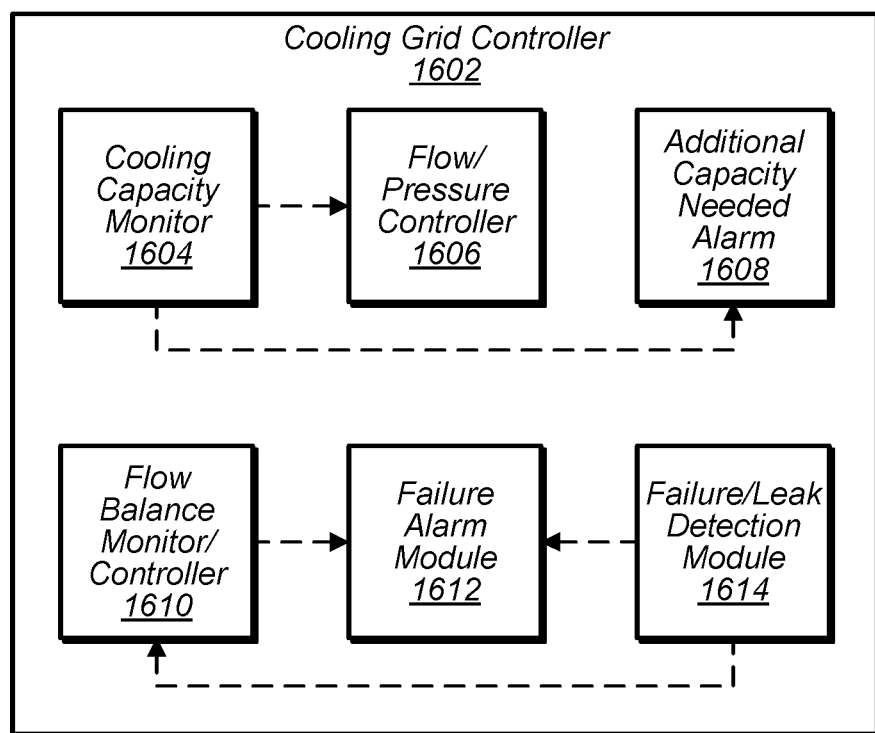
FIG. 16 illustrates a block diagram of a cooling grid controller, according to some embodiments.

FIG. 16 illustrates a block diagram of a cooling grid controller, according to some embodiments.

In some embodiments, any of the cooling grids described herein may include a cooling grid controller, such as cooling grid controller 1602. In some embodiments, cooling grid controller 1602 and power grid controller 802 may be combined into a common controller for a grid, or may be implemented as separate controllers.

In some embodiments, a cooling grid controller, such as cooling grid controller 1602, includes a cooling capacity monitor 1604, a flow/pressure controller 1606, an additional capacity needed controller 1608, a flow balance monitor/controller 1610, a failure alarm 1612, and a failure/leak detection module 1614.

In some embodiments, cooling capacity monitor 1604 monitors overall cooling load versus a current capacity of heat rejection units connected to a cooling grid, such as any of the cooling grids described herein. The cooling capacity monitor 1604 may determine whether or not one or more heat rejection units need to be activated or de-activated in order to better match cooling capacity to current cooling load. The cooling capacity monitor 1604 may instruct flow/pressure controller 1606, to start-up, or shut-down, one or more heat rejection units in order to better match cooling capacity and cooling load. In some embodiments, flow/pressure controller 1606 may preferentially activate lower cost heat rejection units, such as free-cooling heat rejection units or evaporative cooling heat rejection units to provide cooling to the grid before activating higher cost heat rejection units, such as a mechanical chiller. In some embodiments, a cooling capacity monitor and a flow/pressure controller may collectively control cooling fluid flow such that a baseline amount of cooling fluid is provided to the cooling rid from low-cost heat rejection units, and may cause higher cost heat rejection units to flow additional fluid through the cooling grid during spikes in an amount of waste heat being rejected into the cooling grid. Alternatively flow rates may be controlled to be constant and additional heat rejection units may be activated or de-activated to lower an overall temperature of a cooling fluid flowing through a cooling grid.

Cooling capacity monitor 1604 may also monitor overall trends in power load and cause additional capacity needed alarm 1608 to be activated if the overall trends indicate that an additional heat rejection unit needs to be connected to the cooling grid to better match cooling capacity to cooling load. For example, if a cooling trend indicates that an increasing amount of waste heat is being removed by higher cost heat rejection units because lower cost heat rejection units do not have sufficient capacity to meet current demand, a cooling capacity monitor 1604 may determine that additional lower cost heat rejection units need to be connected to a cooling grid and may alert facility personnel of this situation via additional capacity needed alarm 1608.

Flow balance monitor/controller 1610 may cooling fluid flow rates across a grid, which may be indicative of levels of waste heat being rejected into the cooling grid. For example, flow balance monitor/controller 1610 may monitor if more cooling fluid is flowing in a particular area of the grid as compared to other areas of the grid. Also, flow balance monitor/controller 1610 may monitor current cooling fluid flow through respective transport elements and/or nodes of the grid. The flow balance monitor/controller 1610 may activate and/or de-activate heat rejection units on different sides of the grid to better balance cooling fluid flow through the grid. In some embodiments, a flow balance monitor/controller 1610 may work with a flow/pressure controller, such as flow/pressure controller 1606, to activate and/or de-activate heat rejection units on different sides of a grid. Also, failure detection module 1614 may detect failed transport elements and report the failure of one or more transport elements to flow balance monitor/controller 1610 in order to better balance the grid. In some embodiments, flow balance monitor/controller 1610 may report imbalance conditions, wherein there is not a sufficient quantity of heat rejection units on different sides of the grid to balance the grid via failure alarm module 1612. Also, failure detection module 1614 may report failed transport elements via failure alarm module 1612.

Figure 17:
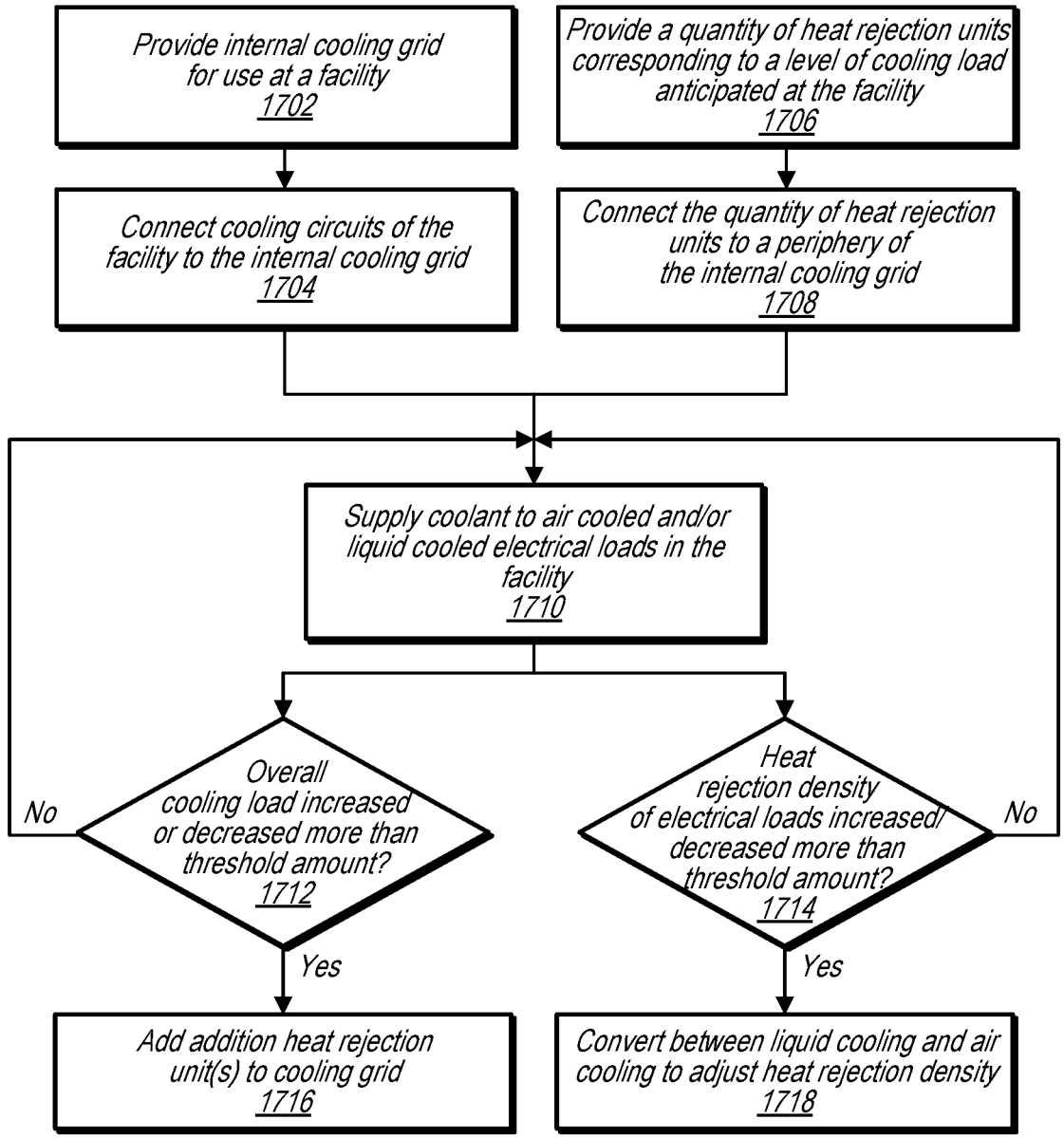
FIG. 17 illustrates a high-level flowchart for providing a cooling grid and adjusting the cooling grid due to changing cooling requirements of loads at a facility, according to some embodiments.

FIG. 17 illustrates a high-level flowchart for providing a cooling grid and adjusting the cooling grid due to changing cooling requirements of loads at a facility, according to some embodiments.

At 1702, a cooling grid to internal use in a facility, such as a data center is provided. The internal cooling grid includes transport elements arranged in a grid pattern and nodes at intersection locations of the grid. Each of the nodes is configured to receive cooling fluid from more than two transport elements and is also configured to return cooling fluid back to two or more transport elements of the cooling grid.

At 1704, the cooling grid is connected to cooling circuit that remove waste heat from heat producing components of electrical loads at the facility. For example, the cooling circuits may flow cooling fluid received from the cooling grid through direct cooling heat exchangers, liquid to air heat exchangers, or a combination of both. At 1706, a quantity of heat rejection units that have a collective cooling capacity that matches an anticipated cooling load at the facility are provided. At 1708, the heat rejection units are connected to the internal cooling grid along a periphery of the cooling grid.

At 1710, cooling fluid is supplied to direct heat exchangers and/or liquid to air heat exchangers that remove waste heat from heat producing components of electrical loads.

At 1712, it is determined if an overall cooling load on the cooling grid has increased or decreased more than a threshold amount as compared to the anticipated cooling load at 1708. If the overall cooling load has not changed more than the threshold amount, the system continues to supply the cooling fluid to cool the heat producing components of electrical loads at the facility. If the overall cooling capacity has increased or decreased more than the threshold amount as compared to the original anticipated cooling load that was used to determine the number of heat rejection units to connect to the cooling grid, at 1716 additional heat rejection units are connected to (or removed from) the cooling grid.

At 1714, it is determined whether a heat rejection density of one or more electrical loads cooled by the cooling grid has increased or decreased more than a threshold amount. If not, the system continues to supply coolant to air cooled and/or liquid cooled electrical loads in the facility. However, if the cooling density has changes, e.g. more concentrated waste heat is being rejected by the heat producing components of the electrical loads, as may be the case when a server is upgraded to a more powerful set of processors, at 1718, the electrical loads are converted between being air cooled and liquid cooled to adjust a heat rejection density from the respective electrical loads. In some embodiments, a cooling capacity monitor, such as cooling capacity monitor 1604 of cooling grid controller 1602, may perform 1712 to determine if the overall cooling grid load has increased or decreased. Also, in some embodiments, a flow/balance alarm 1610 may perform 1714 to determine whether a heat rejection density has changed.

Figure 18:
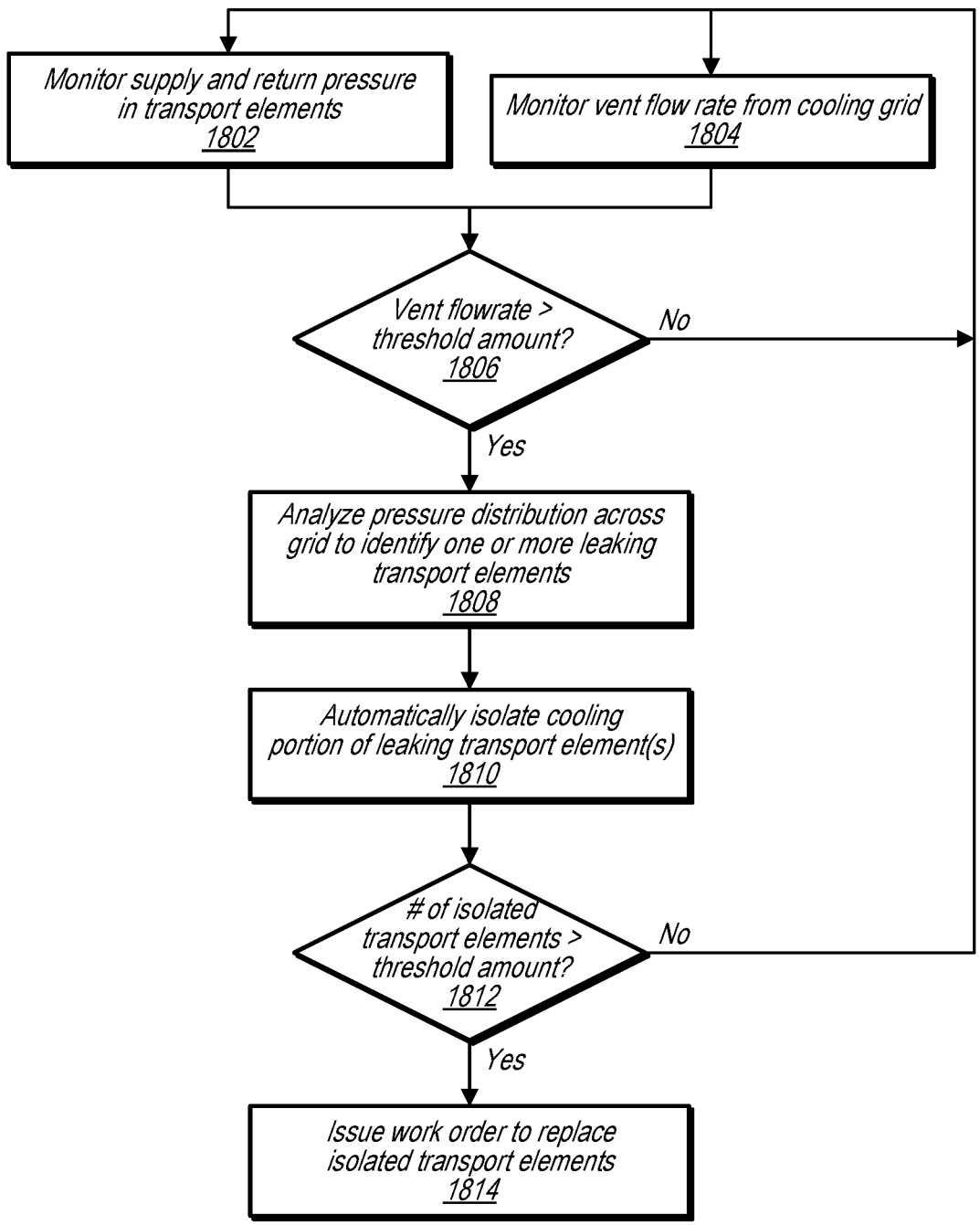
FIG. 18 illustrates a high-level flowchart for monitoring a cooling grid for leaks, according to some embodiments.

FIG. 18 illustrates a high-level flowchart for monitoring a cooling grid for leaks, according to some embodiments.

At 1802, a pressure and flow monitoring system, such as pressure and flow monitoring system 1500 described in regard to FIG. 15 or a failure/leak detection module 1614 of a cooling grid controller 1602 described in regard to FIG. 16, monitors supply and return pressures in transport elements of a cooling grid. Also at 1804, a pressure and flow monitoring system or a failure/leak detection module 1614 of a cooling grid controller 1602, monitors a flow rate of air from being vented from a cooling grid, such as air being removed from a reservoir via a vacuum pump. At 1806, it is determined whether the vent flowrate exceeds a threshold amount, if not the system continues to monitor the vent flow rate at 1804.

If the vent flow rate does exceed the threshold amount, at 1808, respective pressure distributions across the cooling grid measured by an array of pressure transmitters is analyzed to identify one or more leaking transport elements and/or nodes. At 1810, the leaking transport elements (and/or associated nodes) are automatically isolated.

At 1812, it is determined whether or not the number of isolated transport elements exceeds a threshold number of transport elements. If not, the system continues to monitor for additional leaking or failed transport elements. But at 1814, if the number of transport elements exceeds the threshold number the system issues a work order to replace the failed or leaking transport elements that have been isolated.

Example Computer System

Figure 19:
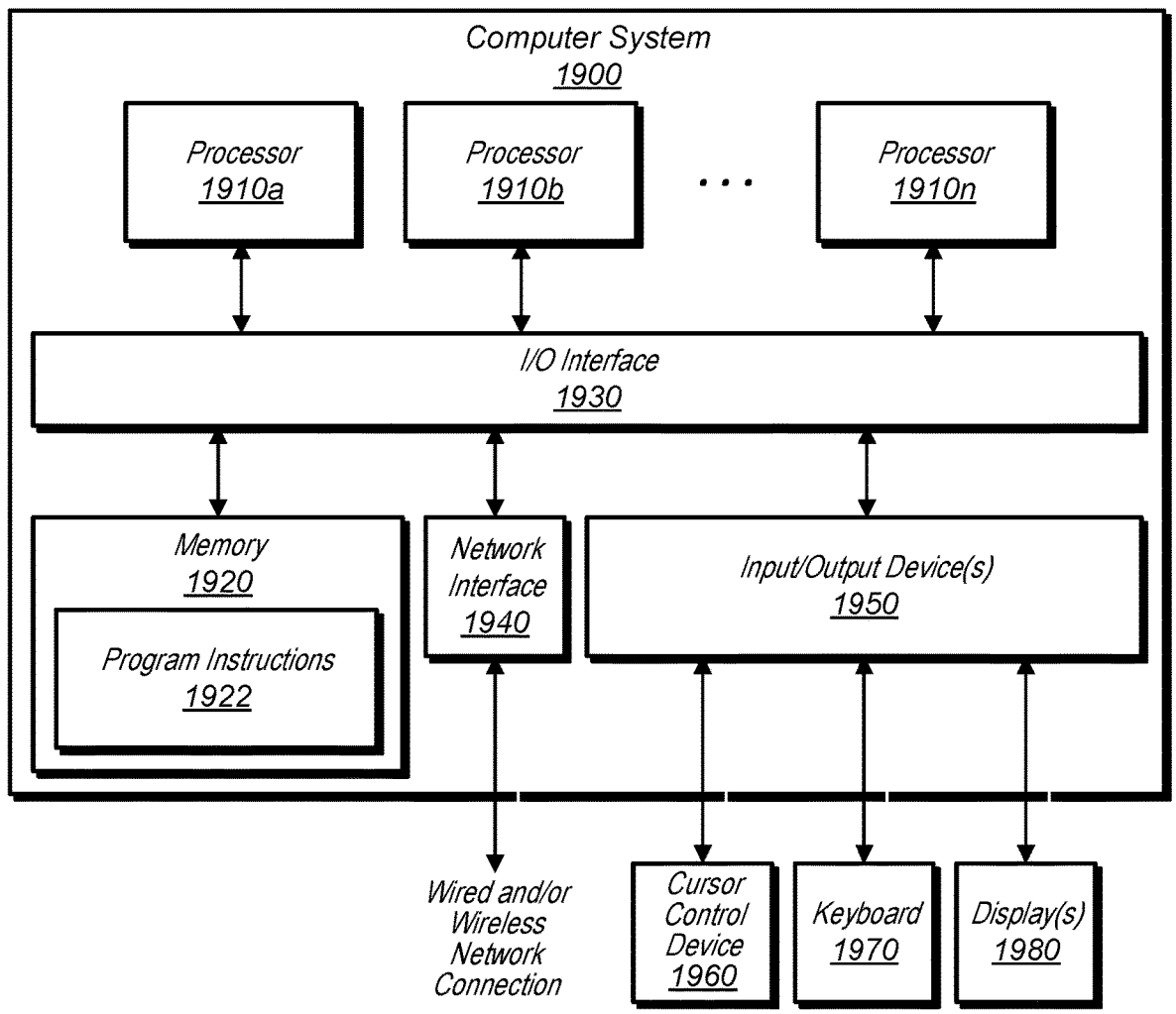
FIG. 19 illustrates an example computer system that may implement a power distribution grid controller and/or a cooling grid controller, according to some embodiments.

FIG. 19 illustrates an example computer system 1900 that may implement a power distribution grid controller, a cooling grid controller, or any other ones of the components described herein, (e.g., any of the components described above with reference to FIGS. 1-18), in accordance with some embodiments. The computer system 1900 may be configured to execute any or all of the embodiments described above. In different embodiments, computer system 1900 may be any of various types of devices, including, but not limited to, a personal computer system, desktop computer, laptop, notebook, mainframe computer system, network computer, a programmable logic controller PLC, or in general any type of computing or electronic device.

Various embodiments of a power distribution grid controller and/or cooling grid controller, as described herein may be executed in one or more computer systems 1900, which may interact with various other devices. Note that any component, action, or functionality described above with respect to FIGS. 1-18 may be implemented on one or more computers configured as computer system 1900 of FIG. 19, according to various embodiments. In the illustrated embodiment, computer system 1900 includes one or more processors 1910 coupled to a system memory 1920 via an input/output (I/O) interface 1930. Computer system 1900 further includes a network interface 1940 coupled to I/O interface 1930, and one or more input/output devices 1950, such as cursor control device 1960, keyboard 1970, and display(s) 1980. In some cases, it is contemplated that embodiments may be implemented using a single instance of computer system 1900, while in other embodiments multiple such systems, or multiple nodes making up computer system 1900, may be configured to host different portions or instances of embodiments. For example, in one embodiment some elements may be implemented via one or more nodes of computer system 1900 that are distinct from those nodes implementing other elements.

In various embodiments, computer system 1900 may be a uniprocessor system including one processor 1910, or a multiprocessor system including several processors 1910 (e.g., two, four, eight, or another suitable number). Processors 1910 may be any suitable processor capable of executing instructions. For example, in various embodiments processors 1910 may be general-purpose or embedded processors implementing any of a variety of instruction set architectures (ISAs), such as the x86, PowerPC, SPARC, or MIPS ISAs, or any other suitable ISA. In multiprocessor systems, each of processors 1910 may commonly, but not necessarily, implement the same ISA.

System memory 1920 may be configured to store program instructions 1922 accessible by processor 1910. In various embodiments, system memory 1920 may be implemented using any suitable memory technology, such as static random access memory (SRAM), synchronous dynamic RAM (SDRAM), nonvolatile/Flash-type memory, or any other type of memory. In the illustrated embodiment, program instructions 1922 may be configured to implement a power distribution grid controller and/or cooling grid controller having any of the functionality described above. In some embodiments, program instructions and/or data may be received, sent or stored upon different types of computer-accessible media or on similar media separate from system memory 1920 or computer system 1900. While computer system 1900 is described as implementing the functionality of functional blocks of previous Figures, any of the functionality described herein may be implemented via such a computer system.

In one embodiment, I/O interface 1930 may be configured to coordinate I/O traffic between processor 1910, system memory 1920, and any peripheral devices in the device, including network interface 1940 or other peripheral interfaces, such as input/output devices 1950. In some embodiments, I/O interface 1930 may perform any necessary protocol, timing or other data transformations to convert data signals from one component (e.g., system memory 1920) into a format suitable for use by another component (e.g., processor 1910). In some embodiments, I/O interface 1930 may include support for devices attached through various types of peripheral buses, such as a variant of the Peripheral Component Interconnect (PCI) bus standard or the Universal Serial Bus (USB) standard, for example. In some embodiments, the function of I/O interface 1930 may be split into two or more separate components, such as a north bridge and a south bridge, for example. Also, in some embodiments some or all of the functionality of I/O interface 1930, such as an interface to system memory 1920, may be incorporated directly into processor 1910.

Network interface 1940 may be configured to allow data to be exchanged between computer system 1900 and other devices attached to a network (e.g., carrier or agent devices) or between nodes of computer system 1900. The network may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1940 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1950 may, in some embodiments, include one or more display terminals, keyboards, keypads, touchpads, scanning devices, voice or optical recognition devices, or any other devices suitable for entering or accessing data by one or more computer systems 1900. Multiple input/output devices 1950 may be present in computer system 1900 or may be distributed on various nodes of computer system 1900. In some embodiments, similar input/output devices may be separate from computer system 1900 and may interact with one or more nodes of computer system 1900 through a wired or wireless connection, such as over network interface 1940.

As shown in FIG. 19, memory 1920 may include program instructions 1922, which may be processor-executable to implement any element or action described above. In one embodiment, the program instructions may implement the methods described above. In other embodiments, different elements and data may be included. Note that data may include any data or information described above.

Those skilled in the art will appreciate that computer system 1900 is merely illustrative and is not intended to limit the scope of embodiments. In particular, the computer system and devices may include any combination of hardware or software that can perform the indicated functions, including computers, network devices, etc. Computer system 1900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1900 may be transmitted to computer system 1900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
  a data center comprising:
    heat producing components mounted in different locations within the data center; and
    an internal cooling grid positioned in the data center, wherein the internal cooling grid comprises:
      cooling fluid transport elements arranged in a grid pattern; and
      nodes located at intersections of the grid pattern; and
  heat rejection units connected to the internal cooling grid and configured to remove heat from a cooling fluid flowing through the internal cooling grid,
    wherein respective ones of the nodes are configured to:
      receive cooling fluid from, and return the cooling fluid to, multiple ones of the cooling fluid transport elements connected to the respective node,
      provide the received cooling fluid for use in removing heat from one or more pieces of the heat producing components, and
      receive cooling fluid that has been used to remove heat from the one or more pieces of heat producing components, and
    wherein the respective ones of the nodes are connected to:
      cooling fluid supply lines included in respective ones of the multiple cooling fluid transport elements connected to the node,
      cooling fluid return lines included in the respective ones of the multiple cooling fluid transport elements connected to the node.

2. The system of claim 1, wherein the heat producing components are included in servers or networking devices mounted in racks located in different locations within the data center.

3. The system of claim 2, wherein at least some of the racks further comprise a liquid to air heat exchanger, and
  wherein the heat producing components in the at least some of the racks are air cooled by air that has been cooled by a portion of the cooling fluid that is received from, and returned to, the internal cooling grid via respective ones of the nodes, wherein the portion of the cooling fluid received from, and returned to, the cooling grid via the respective nodes flows through respective liquid to air heat exchangers.

4. The system of claim 1, wherein the heat producing components are liquid cooled by respective liquid cooling circuits connected to the internal cooling grid via the respective ones of the nodes.

5. A cooling grid, comprising:
  cooling fluid transport elements arranged in a grid pattern to provide cooling support to compute, networking, or data storage equipment in a facility; and
  nodes located at intersections of the grid pattern;

wherein the cooling fluid transport elements and nodes are arranged in the facility such that respective ones of the nodes are configured to receive cooling fluid from, and return the cooling fluid to, multiple ones of the fluid transport elements, and wherein respective ones of the nodes are configured to:
provide the received cooling fluid to a cooling circuit for use in removing heat from one or more pieces of the compute, networking, or data storage equipment, and receive cooling fluid from the cooling circuit that has been used to remove heat from the one or more pieces of compute, networking, or data storage equipment, and wherein the respective ones of the nodes are connected to:
cooling fluid supply lines included in respective ones of the multiple cooling fluid transport elements connected to the node, cooling fluid return lines included in the respective ones of the multiple cooling fluid transport elements connected to the node.

6. The cooling grid of claim 5, wherein each node is further connected to:
a supply line from the node to the one or more pieces of compute, networking, or data storage equipment that are cooled using cooling fluid from the node; and a return line from the one or more pieces of compute, networking, or data storage equipment that are cooled using the cooling fluid from the node.

7. The cooling grid of claim 6, wherein respective absolute pressures of the cooling fluid flowing in the cooling fluid supply lines and the cooling fluid return lines are less than one atmosphere.

8. The cooling grid of claim 6, further comprising a cooling grid controller configured to:
monitor one or more cooling fluid flows through the cooling fluid transport elements, and activate or deactivate one or more heat rejection units in response to detecting an imbalance in the cooling fluid flows.

9. The cooling grid of claim 5, further comprising:
heat rejection units connected to the cooling grid and configured to remove heat from the cooling fluid flowing through the cooling grid.

10. The cooling grid of claim 9, wherein the heat rejection units are modular units configured to be connected to the cooling grid or disconnected from the cooling grid while the cooling fluid is flowing through the cooling grid.

11. The cooling grid of claim 10, wherein the modular heat rejection units comprise an evaporative cooling unit or a free cooling unit.

12. The cooling grid of claim 10, wherein the modular heat rejection units comprise a mechanical cooling unit or an absorption refrigeration cooling unit.

13. The cooling grid of claim 5, further comprising:
an insulated tank configured to store a portion of the cooling fluid, wherein, during periods of high cooling load, cooling fluid flowing through the insulated tank causes a temperature of a mass of cooling fluid in the insulated tank to increase, and wherein, during periods of lower cooling load, cooling fluid flowing through the insulated tank causes a temperature of a mass of cooling fluid in the tank to decrease.

14. The cooling grid of claim 5, further comprising:
an array of pressure sensors connected to respective ones of the cooling fluid transport elements or nodes; and a cooling grid monitoring system configured to:
compare pressure readings received from respective ones of the array of pressure sensors; and identify a leaking cooling fluid transport element or node.

15. A method, comprising:
providing a cooling grid for a facility, wherein the cooling grid comprises:
cooling fluid transport elements arranged in a grid pattern to provide cooling support to compute, networking, or data storage equipment in the facility; and nodes located at intersections of the grid pattern; and flowing a cooling fluid through the cooling grid to provide cooling to the compute, networking, or data storage equipment in the facility, wherein respective pieces of compute, networking, or data storage equipment connected to a particular node are supplied cooling fluid that is received at the particular node from two or more of the fluid transport elements connected to the particular node.

16. The method of claim 15, further comprising:
connecting one of the nodes to a liquid cooling system to cool pieces of the compute, networking, or data storage equipment that generate concentrated waste heat.

17. The method of claim 15, wherein flowing the cooling fluid through the cooling grid to provide cooling to the compute, networking, or data storage equipment in the facility comprises:
flowing the cooling fluid through a liquid to air heat exchanger connected to one of the nodes: and flowing the cooling fluid through a cooling circuit of a liquid cooled computing device connected to the one node or another node of the cooling grid.

18. The method of claim 15, further comprising:
monitoring respective cooling fluid pressures in respective ones of the cooling fluid transport elements or nodes; and in response to detecting a pressure anomaly, automatically isolating one of the cooling fluid transport elements.

19. The method of claim 15, wherein respective absolute pressures of the cooling fluid flowing in cooling fluid supply lines and the cooling fluid return lines of the cooling fluid transport elements are less than one atmosphere, the method further comprising:
monitoring a flowrate of air being removed from the cooling grid;

in response to the flowrate of air being removed from the cooling grid exceeding a threshold amount, analyzing respective cooling fluid pressures in respective ones of the cooling fluid transport elements or nodes to identify a leaking cooling fluid transport element; and automatically isolating the leaking cooling fluid transport element.

20. The method of claim 15, further comprising:
detecting failures of cooling fluid transport elements; and refraining from generating an order to repair the failed cooling fluid transport elements until a threshold number of failed cooling fluid transport elements has been reached.

* * * * *